(12) United States Patent
Takiguchi et al.

(10) Patent No.: US 9,748,737 B2
(45) Date of Patent: Aug. 29, 2017

(54) LASER ELEMENT AND LASER DEVICE

(71) Applicant: HAMAMATSU PHOTONICS K.K., Hamamatsu-shi, Shizuoka (JP)

(72) Inventors: Yuu Takiguchi, Hamamatsu (JP); Yoshiro Nomoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/772,826

(22) PCT Filed: Mar. 7, 2014

(86) PCT No.: PCT/JP2014/056045
§ 371 (c)(1),
(2) Date: Sep. 4, 2015

(87) PCT Pub. No.: WO2014/136962
PCT Pub. Date: Sep. 12, 2014

(65) Prior Publication Data
US 2016/0020580 A1    Jan. 21, 2016

(30) Foreign Application Priority Data

Mar. 7, 2013 (JP) ................................ 2013-045826

(51) Int. Cl.
*H01S 5/10* (2006.01)
*H01S 5/187* (2006.01)
(Continued)

(52) U.S. Cl.
CPC .............. *H01S 5/105* (2013.01); *H01S 5/187* (2013.01); *H01S 5/4075* (2013.01); *H01S 5/42* (2013.01);
(Continued)

(58) Field of Classification Search
CPC ....................................................... H01S 5/105
See application file for complete search history.

(56) References Cited

U.S. PATENT DOCUMENTS

| 6,826,209 B1* | 11/2004 | Morita .................. H01S 3/0057 372/101 |
| 2003/0001164 A1* | 1/2003 | Fujihara ............... G02B 6/4208 257/81 |

(Continued)

FOREIGN PATENT DOCUMENTS

| JP | 2003-023193 A | 1/2003 |
| JP | 2003-298183 A | 10/2003 |

(Continued)

*Primary Examiner* — Tod T Van Roy
(74) *Attorney, Agent, or Firm* — Drinker Biddle & Reath LLP

(57) ABSTRACT

A laser element includes a photonic crystal layer on which laser light is incident. The photonic crystal layer includes a base layer formed of a first refractive index medium; and a plurality of different refractive index regions formed of a second refractive index medium having a refractive index different from that of the first refractive index medium and disposed in the base layer. The plurality of different refractive index regions includes a first different refractive index region of which a planar shape is an approximate circle, an approximate square, or an approximate polygon having a rotational symmetry of 90° and a first area perpendicular to a thickness direction; and a second different refractive index region having a second area perpendicular to a thickness direction.

4 Claims, 34 Drawing Sheets

(51) Int. Cl.
    *H01S 5/42*     (2006.01)
    *H01S 5/40*     (2006.01)
    *H01S 5/00*     (2006.01)
(52) U.S. Cl.
    CPC ......... *H01S 5/0071* (2013.01); *H01S 2301/18* (2013.01); *H01S 2301/20* (2013.01)

(56) References Cited

U.S. PATENT DOCUMENTS

| | | | |
|---|---|---|---|
| 2009/0010298 A1* | 1/2009 | Kiyota | B82Y 20/00 372/96 |
| 2009/0016395 A1* | 1/2009 | Noda | H01S 5/183 372/41 |
| 2011/0261856 A1 | 10/2011 | Fattal et al. | |

FOREIGN PATENT DOCUMENTS

| | | |
|---|---|---|
| JP | 2004-253811 A | 9/2004 |
| JP | 2004-296538 A | 10/2004 |
| JP | 2007-180120 A | 7/2007 |
| JP | 2007-208127 A | 8/2007 |
| JP | 2007-258260 A | 10/2007 |
| JP | 2009-016370 A | 1/2009 |
| JP | 2009-076900 A | 4/2009 |
| JP | 2010-056446 A | 3/2010 |
| JP | 2012-119635 A | 6/2012 |
| JP | 2013-041948 A | 2/2013 |
| WO | WO-2011/108510 A1 | 9/2011 |

\* cited by examiner

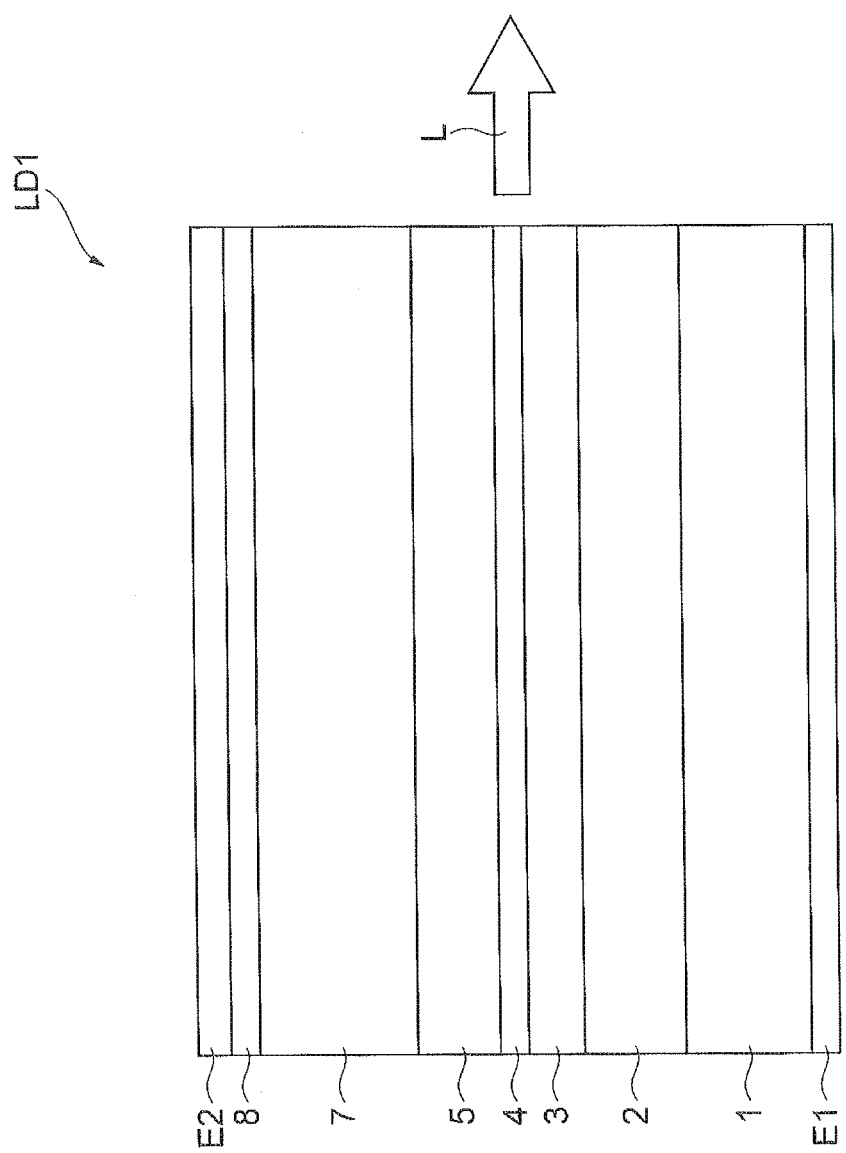

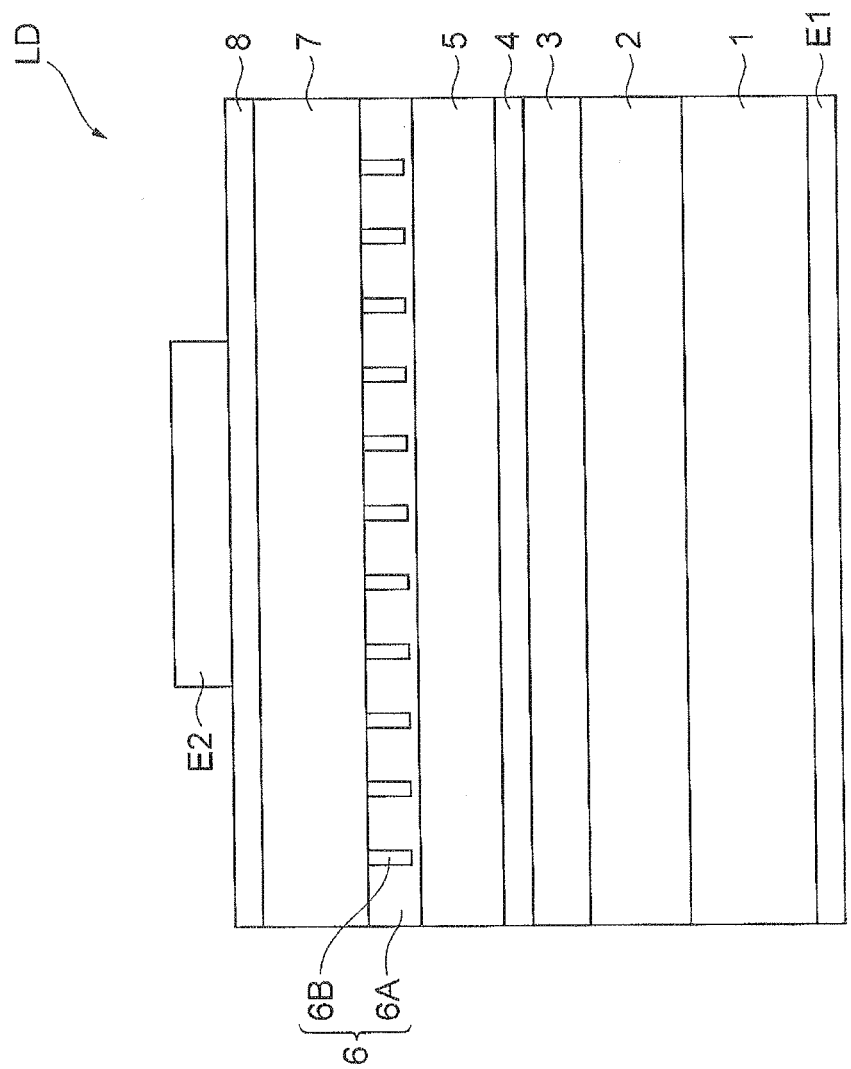

Fig. 6

| | MATERIAL | CONDUCTIVITY TYPE | THICKNESS (nm) |
|---|---|---|---|
| CONTACT LAYER 8 | GaAs | P | 50~500 (200) |
| UPPER CLADDING LAYER 7 | AlGaAs | P | $1 \times 10^3$~ $3 \times 10^3$ ($2 \times 10^3$) |
| PHOTONIC CRYSTAL LAYER 6 (PHASE MODULATION LAYER) | BASE LAYER 6A: GaAs BURIED LAYER 6B: AlGaAs | — | 50~200 (100) |
| UPPER LIGHT GUIDE LAYER 5 | UPPER LAYER: GaAs | — | 10~200 (50) |
| | LOWER LAYER: AlGaAs | P(I) | 10~100 (50) |
| ACTIVE LAYER 4 | MQW: AlGaAs/InGaAs | — | 10~100 (30) |
| LOWER LIGHT GUIDE LAYER 3 | AlGaAs | — | 0~300 (150) |
| LOWER CLADDING LAYER 2 | AlGaAs | N | $1 \times 10^3$~ $3 \times 10^3$ ($2 \times 10^3$) |
| SEMICONDUCTOR SUBSTRATE 1 | GaAs | N | $80 \times 10^3$~ $350 \times 10^3$ ($150 \times 10^3$) |

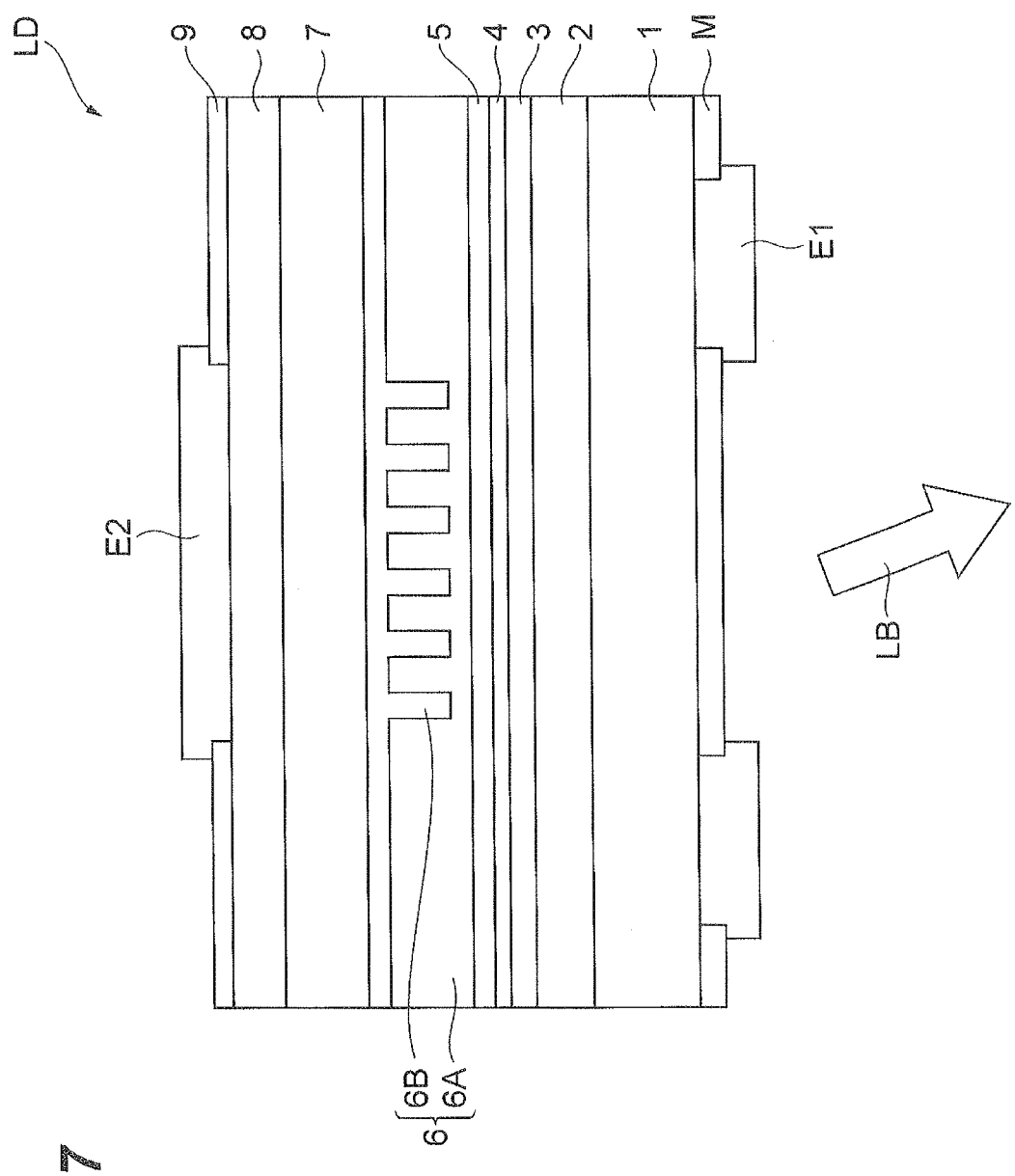

Fig.9
(A) $\phi=0$
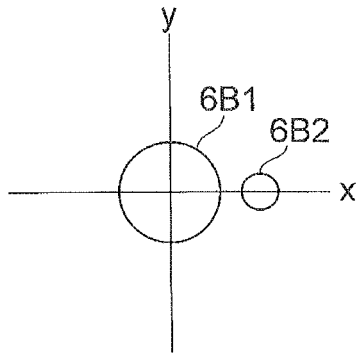
(B) $\phi=0.25\pi$
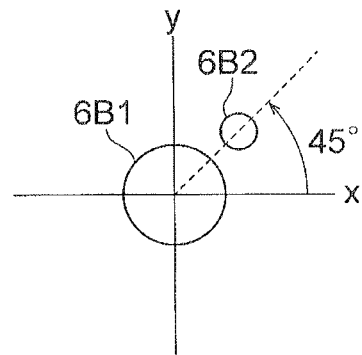
(C) $\phi=0.5\pi$
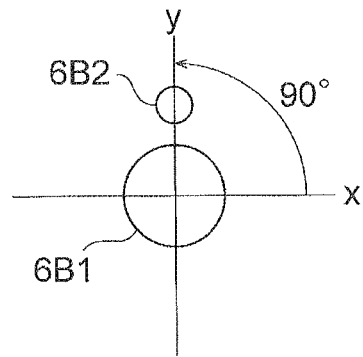
(D) $\phi=0.75\pi$
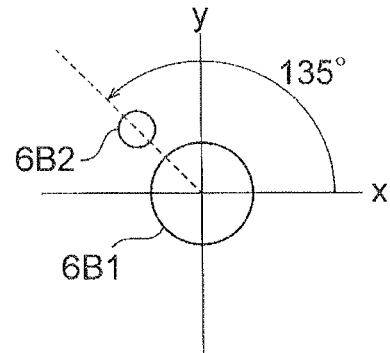
(E) $\phi=\pi$
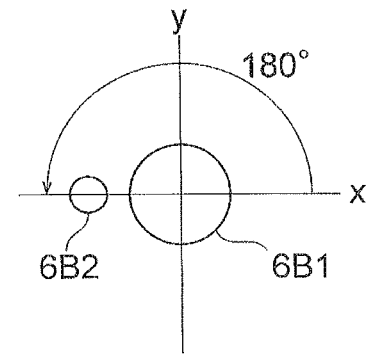
(F) $\phi=1.7\pi$
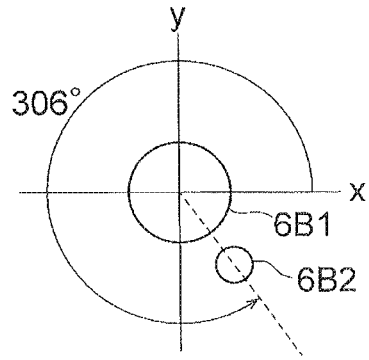

Fig.12
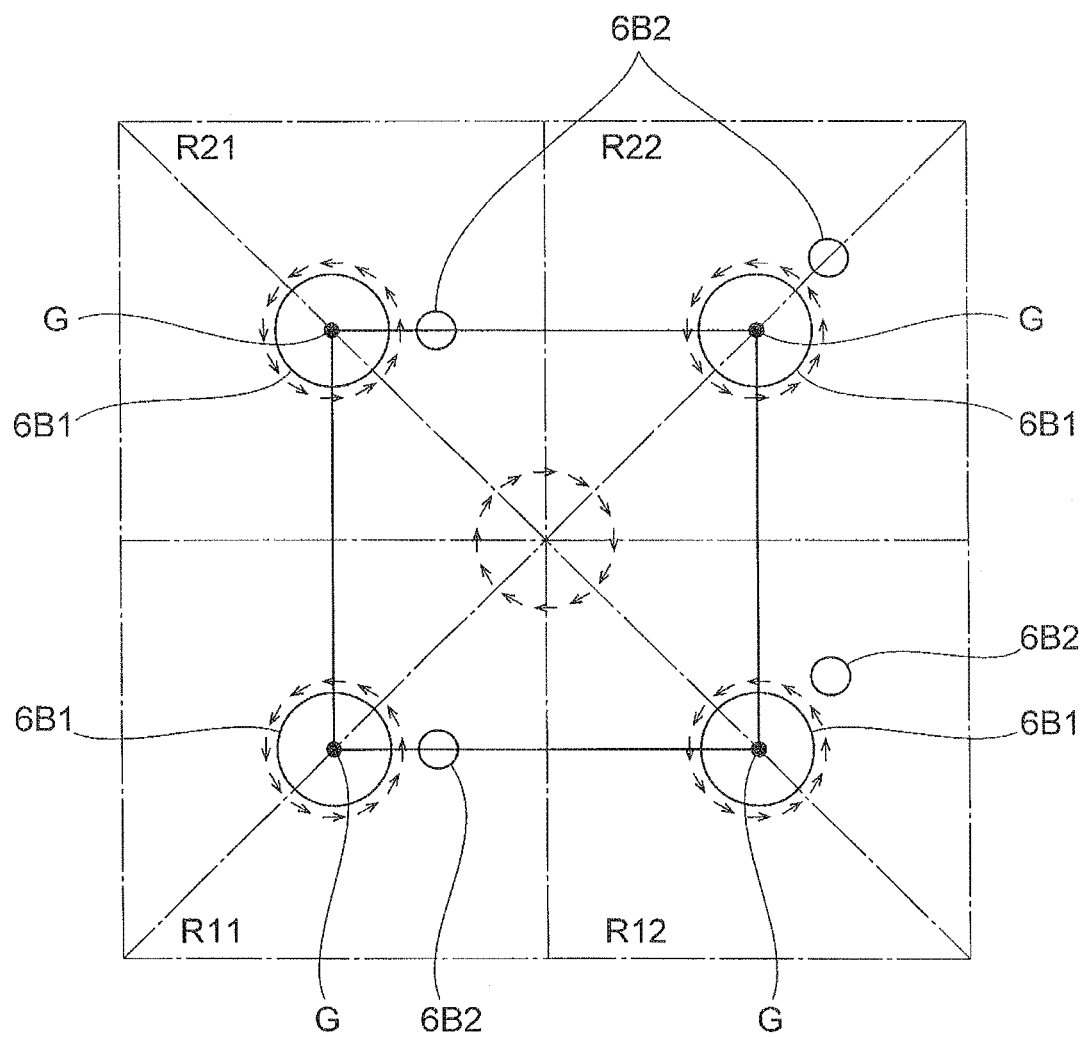
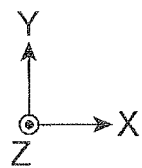

*Fig.33*
(A)
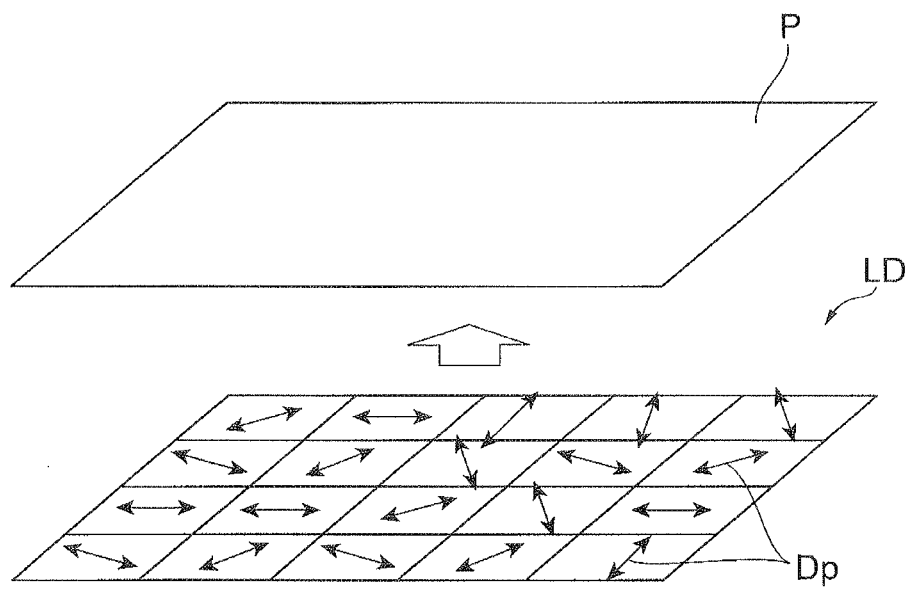
(B)
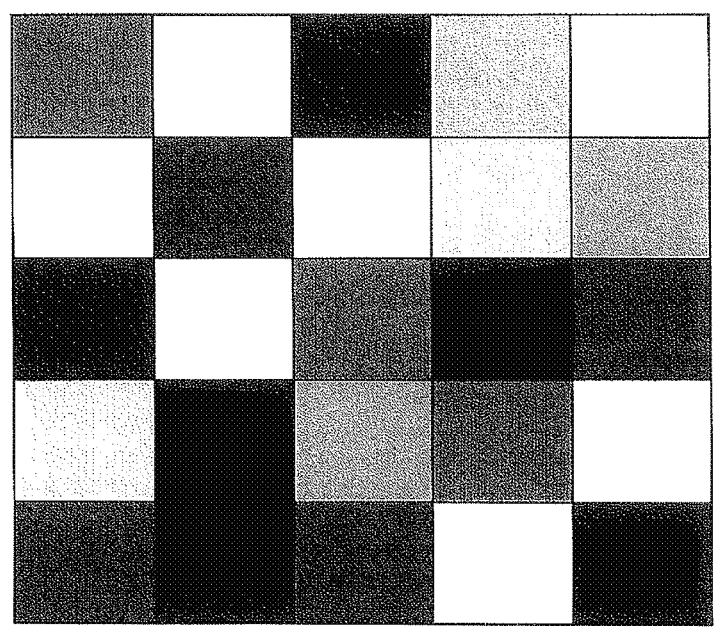

LASER ELEMENT AND LASER DEVICE

TECHNICAL FIELD

The present invention relates to a laser element and a laser device.

BACKGROUND ART

A photonic crystal layer used in a laser element of Patent Literature 1 is configured by periodically burying a plurality of different refractive index regions within a base layer that becomes a base. The laser element includes two-layered photonic crystal layers. Each of the photonic crystal layers has the same patterns periodically arranged, but the patterns are different for each photonic crystal layer.

Patent Literature 2 discloses an example of a technique related to an intensity of linear polarization of a laser beam. According to Patent Literature 2, conventionally, a plurality of circular different refractive index regions has been embedded in the base layer constituting the photonic crystal layer respectively at lattice point positions of a square lattice. In this case, a problem that polarization directions in a plane are not constant has been pointed out. That is, an electric field vector (polarization direction) is generated so as to surround the periphery of each of the different refractive index region, due to performance degradation of a mode, which occurs within the photonic crystal layer. In this regard, Patent Literature 2 discloses a technique in which the performance degradation of the mode is solved by disposing another different refractive index region at an asymmetric position deviated from the square lattice, and it is possible to arrange directions of the electric field vectors as a whole.

CITATION LIST

Patent Literature

Patent Literature 1 JP 2009-76900 A
Patent Literature 2 JP 2003-23193 A

SUMMARY OF INVENTION

Technical Problem

Recently, a laser element and a laser device capable of outputting laser beams having various patterns have been expected.

The present invention has been made in an effort to solve the above problems and an object of the present invention is to provide a laser element and a laser device capable of emitting laser beams having various patterns.

Solution to Problem

To solve the above problems, the present inventors have found out from the result of intensive studies on a laser element structure that, by devising different refractive index regions in a photonic crystal layer, it is possible to emit laser beams having various patterns in such a way of disposing, in the vicinity of a first different refractive index region, a second different refractive index region which is finer than first different refractive index region, and changing a rotation position of the second different refractive index region with respect to the first refractive index area, according to coordinates, the first different refractive index region having an approximate circle, an approximate square, or an approximate regular polygon having a rotational symmetry of 90°.

In addition, the approximate circle, the approximate square, or the approximate regular polygon having a rotational symmetry of 90° are designed to have a circle, a regular square, or a polygon having a rotational symmetry of 90°, but are intended to include shapes which are distorted little upon manufacture.

Specifically, a laser element according to an aspect includes a photonic crystal layer on which laser light is incident, wherein the photonic crystal layer includes a base layer formed of a first refractive index medium; and a plurality of different refractive index regions formed of a second refractive index medium having a refractive index different from that of the first refractive index medium and disposed in the base layer, the plurality of different refractive index regions includes a first different refractive index region of which a planar shape is an approximate circle, an approximate square, or an approximate regular polygon having a rotational symmetry of 90°; and a first area perpendicular to a thickness direction; and a second different refractive index region having a second area perpendicular to a thickness direction, the second area is smaller than the first area, a unit configuration region includes one first different refractive index region and one second different refractive index region provided in vicinity of the first different refractive index region, in the unit configuration region, a rotational angle of the second different refractive index region with respect to the first different refractive index region is denoted by $\phi$, in an XY plane including an X axis and an Y axis, a plurality of the unit configuration regions is two-dimensionally arranged, XY coordinates of each of the unit configuration regions is given to a central position of the first different refractive index region, and when the XY coordinates of the unit configuration region are (X, Y), the rotational angle $\phi$ are different depending on positions, and at least three different rotational angles $\phi$ are contained in all of the photonic crystal layer. In the present invention, it is possible to obtain laser beams having various patterns by combining three or four sets of intensity patterns. At this time, since the present invention is based on the principle that the intensity of each area is modulated by changing the rotational angle $\phi$ of the second different refractive index region, three or more different rotational angles are inevitably included.

In addition, the laser element includes: an active layer configured to emit the laser light; upper and lower cladding layers between which the active layer is interposed; and the photonic crystal layer disposed between the upper or lower cladding layer and the active layer.

In addition, a laser device includes: the laser element; and a polarizing plate disposed to face a light emitting surface of the laser element.

Advantageous Effects of Invention

According to the laser element and the laser device of the present invention, it is possible to emit laser beams having various patterns.

BRIEF DESCRIPTION OF DRAWINGS

FIG. 4 is a diagram illustrating a configuration of a laser element body portion.

FIG. 5 is a diagram illustrating a longitudinal sectional configuration of a third laser element.

FIG. 6 is a table showing a relationship between material, a conductivity type, and a thickness (nm) of components constituting a laser element.

FIG. 7 is a diagram illustrating a longitudinal sectional configuration of a fourth laser element.

FIG. 9 is a diagram for describing a positional relationship of different refractive index regions.

FIG. 12 is a diagram illustrating a positional relationship between different refractive index regions and an electric field distribution.

FIG. 33 is a diagram illustrating a laser device including a laser element and a polarizing plate.

DESCRIPTION OF EMBODIMENTS

Figure 1:
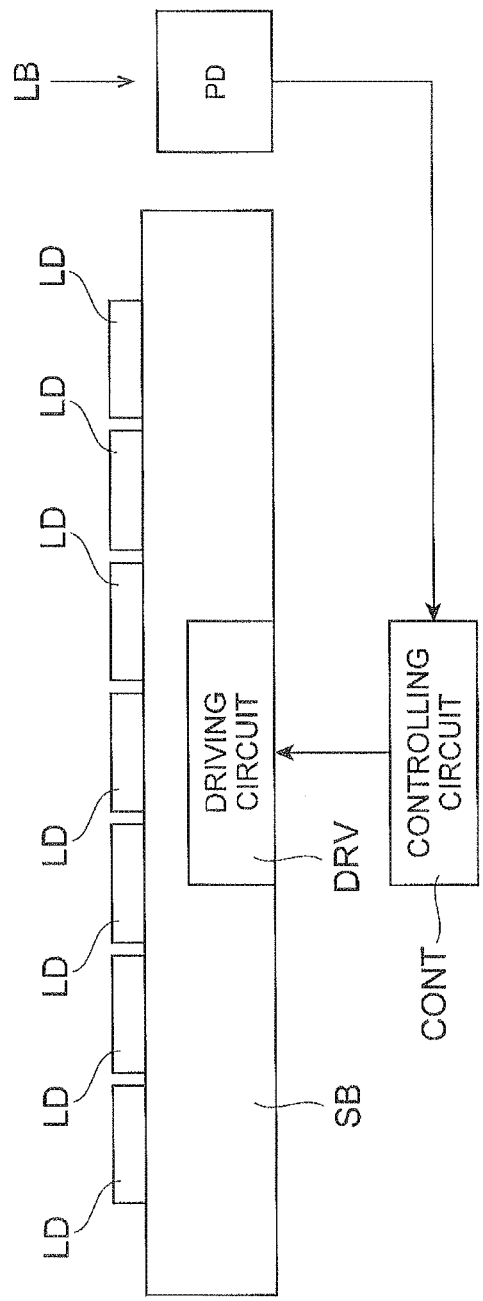
FIG. 1 is a diagram illustrating a configuration of a laser device.

Hereinafter, exemplary embodiments of a laser element and a laser device will be described. Like reference numerals are used to denote like structural elements and redundant descriptions thereof will be omitted.

FIG. 1 is a diagram illustrating a configuration of a laser device.

A plurality of laser elements LD is one-dimensionally or two-dimensionally arranged on a support board SB. Each of the laser elements LD is driven by a driving circuit DRV provided in a rear surface of or inside the support board SB. That is, the driving circuit DRV supplies a driving current of each of the laser elements LD according to an instruction from a controlling circuit CONT. For example, the driving current is supplied to the two-dimensionally arranged laser elements LD according to a sequential order of addresses where the laser elements LD are arranged. A laser beam is emitted from the laser element LD in a direction perpendicular to the board. When the laser elements LD are sequentially lighted in the order of addresses, the object is scanned by the laser beam in a pseudo manner. A laser beam LB reflected by the target object can be detected by a photo-detector PD, such as a photo-diode.

A detection signal indicating a laser beam intensity, which is detected by the photo-detector PD, is input to the controlling circuit CONT. When the laser elements LD are pulse-driven, the photo-detector PD can measure a time from an emission timing to a detection timing of the laser beam, that is, measure a distance to the target object.

The laser device can be used for, for example, the following use. For example, the laser device can be used to emit the laser beam to the target object and measure a distance to a laser beam irradiation position, thereby measuring a three-dimensional shape of the target object. When three-dimensional shape data is used, various machining devices or medical devices can use the three-dimensional shape data. In addition, when the laser beam is output to a moving object such as a vehicle, it is possible to measure a distance according to a direction toward an obstacle, and use a brake or a handle as a safety apparatus that performs automatic control or assist control, according to the distance.

A detailed structure of a laser element to be used in the aforementioned laser device will be described below. The laser element can emit laser light having various intensity patterns.

Figure 2:
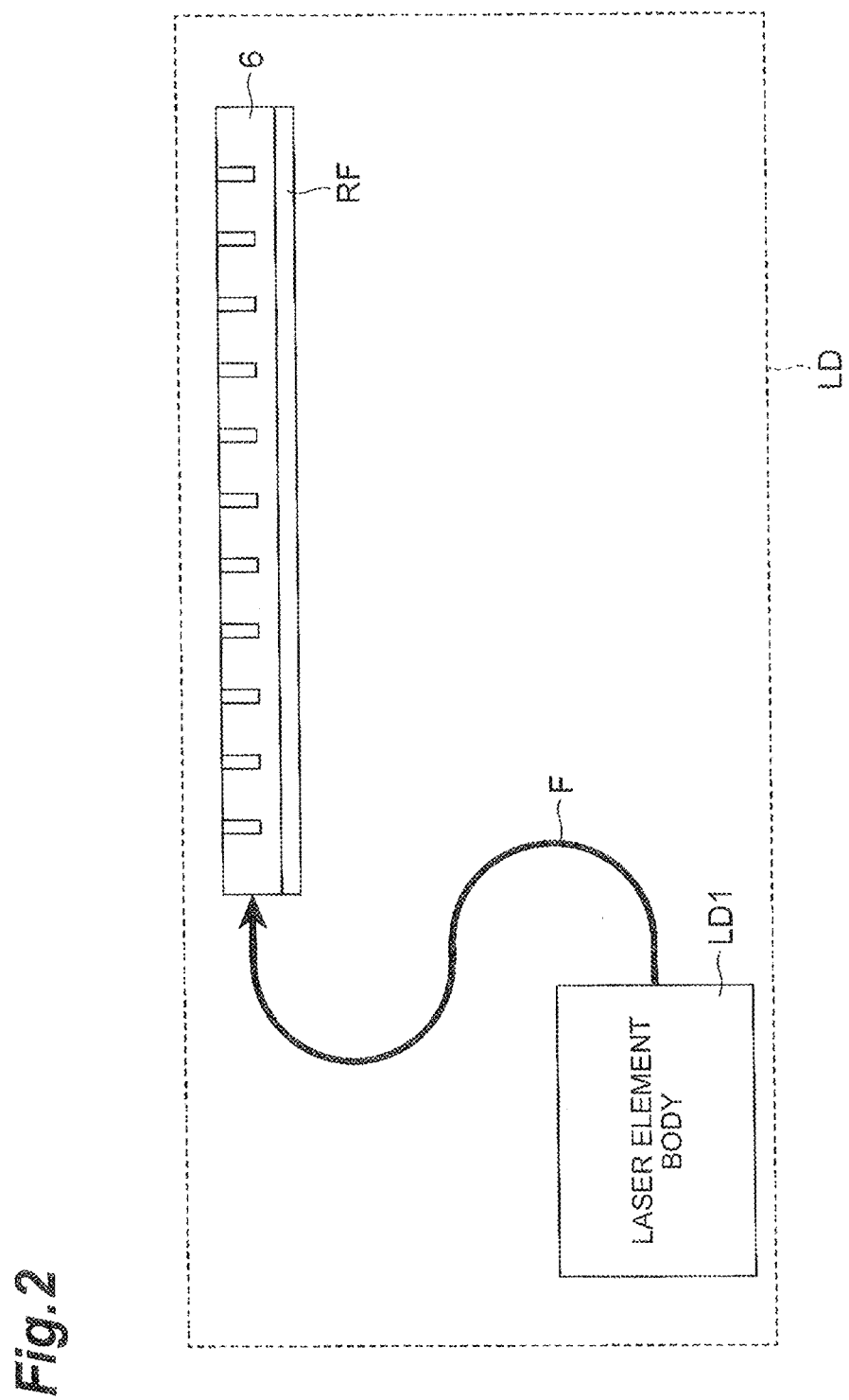
FIG. 2 is a diagram illustrating a configuration of a first laser element.

FIG. 2 is a diagram illustrating a configuration of a first laser element.

The laser element LD includes a photonic crystal layer 6 on which laser light is incident. The laser light is incident into the photonic crystal layer 6 through an optical fiber F or directly, from a laser element body LD1, such as a semiconductor laser element. The optical fiber F is attached to a side surface of the photonic crystal layer 6. There may be provided a plurality of optical fibers F. In this case, the laser light is incident into the photonic crystal layer 6 from the plurality of optical fibers F arranged along the side surface of the photonic crystal layer 6. The laser light which is incident into the photonic crystal layer 6 forms a predetermined mode according to a photonic crystal lattice of the photonic crystal layer 6 and emits a laser beam to the outside in a direction perpendicular to a surface of the photonic crystal layer 6. A reflection film RF which is formed of metal, such as aluminum is provided on a lower surface of the photonic crystal layer 6. The laser light traveling in a direction of the lower surface of the photonic crystal layer 6 is reflected by the reflection film RF and is directed to a direction of an upper surface of the photonic crystal layer 6. Therefore, the intensity of the laser beam LB increases by the reflection film RF.

Figure 3:
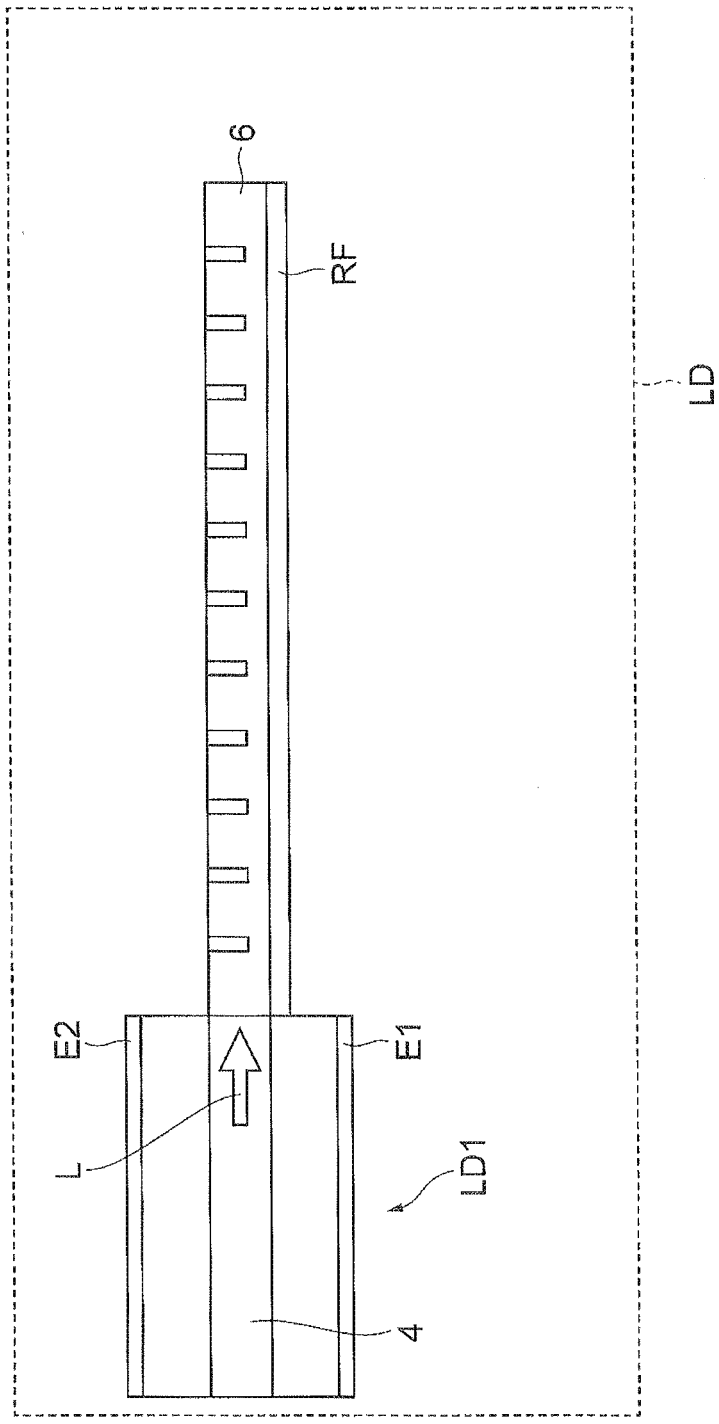
FIG. 3 is a diagram illustrating a configuration of a second laser element.

FIG. 3 is a diagram illustrating a configuration of a second laser element.

The laser element LD is configured by disposing the side surface of the aforementioned photonic crystal layer 6 directly adjacent to an end surface of an edge-emitting laser element body LD1. The side surface of the photonic crystal layer 6 may be fixed to the end surface of the laser element body LD1 by using adhesive or the like. Also, it is possible to continuously form both of the laser element body LD1 and the photonic crystal layer 6 from one semiconductor substrate, by adjusting a thickness of the photonic crystal layer 6. The laser element body LD1 is configured by laminating a compound semiconductor layer. A first electrode E1 is provided on a lower surface of a corresponding laminate and a second electrode E2 is provided on an upper surface of the laminate. By supplying a driving current between the first electrode E1 and the second electrode E2, an active layer 4 of the laser element body LD1 emits light, and laser light L is incident into the photonic crystal layer 6. The incident laser light forms a predetermined mode inside the photonic crystal layer 6 and emits a laser beam in a direction perpendicular to a substrate surface. A reflection film RF as described above is provided on a lower surface of the photonic crystal layer 6 and a similar effect as described above is achieved.

FIG. 4 is a diagram illustrating a configuration of the aforementioned laser element body LD1.

On the semiconductor substrate 1, a lower cladding layer 2, a lower light guide layer 3, an active layer 4, an upper light guide layer 5, an upper cladding layer 7, and a contact layer 8 are sequentially laminated. A first electrode E1 is provided on a lower surface of the semiconductor substrate 1, and a second electrode E2 is provided on an upper surface of the contact layer 8. When a driving current is supplied between the first electrode E1 and the second electrode E2, recombination of electrons and holes occur inside the active layer 4 and therefore, the active layer 4 emits light. A carrier to contribute light emission and generated light are effectively trapped by the upper and lower light guide layers 3 and 5 and the cladding layers 2 and 7 therebetween. In addition, the first electrode E1 is provided on an entire lower surface of the semiconductor substrate 1 and the second electrode E2 is provided on a partial area of an upper layer of the contact layer 8 so as to extend along a resonant length direction (an emission direction of the laser light L).

As described above, the laser light L emitted from the laser element body LD1 is incident into the photonic crystal layer 6.

FIG. 5 is a diagram illustrating a longitudinal sectional configuration of a third laser element.

The laser element LD has a structure in which a photonic crystal layer 6 is incorporated into a laser element body illustrated in FIG. 4, forming a so-called photonic crystal surface emission laser.

The laser element LD includes an active layer 4 that generates laser light, an upper cladding layer 7 and a lower cladding layer 2 between which the active layer 4 is interposed, and light guide layers 3 and 5 which are disposed between the upper cladding layer 7 and the lower cladding layer 2 and between which the active layer 4 is interposed. The photonic crystal layer 6 is disposed between the upper cladding layer 7 and the active layer 4. In the structure illustrated in FIG. 5, a second electrode E2 is provided in a central area of a contact layer 8.

In the structure, on a semiconductor substrate 1, the lower cladding layer 2, the lower light guide layer 3, the active layer 4, the upper light guide layer 5, the photonic crystal layer 6, the upper cladding layer 7, and the contact layer 8 are sequentially laminated. A first electrode E1 is provided in a lower surface of the semiconductor substrate 1, and the second electrode E2 is provided in an upper surface of the contact layer 8. When a driving current is supplied between the first electrode E1 and the second electrode E2, recombination of electrons and holes occur inside the active layer 4, and the active layer 4 emits light. A carrier to contribute light emission and generated light are effectively trapped by the upper and lower light guide layers 3 and 5 and the cladding layers 2 and 7 therebetween.

The laser light emitted from the active layer 4 is incident into the photonic crystal layer 6, forming a predetermined mode. In addition, the photonic crystal layer 6 includes a base layer 6A formed of a first refractive index medium and a plurality of different refractive index regions 6B formed of a second refractive index medium having a refractive index different from that of the first refractive index medium and disposed inside the base layer 6A. The plurality of different refractive index regions 6B includes a periodic structure. The laser light incident into the photonic crystal layer 6 is emitted as a laser beam to the outside perpendicularly to a substrate surface, through the upper cladding layer 7, the contact layer 8, and the upper electrode E2.

FIG. 6 is a table showing a relationship between material, a conductivity type, and a thickness (nm) of compound semiconductor layers constituting a laser element.

The materials of each element are as illustrated in FIG. 6. The semiconductor substrate 1 is made of GaAs and the lower cladding layer 2 is made of AlGaAs. The lower light guide layer 3 is made of AlGaAs, the active layer 4 is made of a multiple quantum well structure MQW (barrier layer: AlGaAs/well layer: InGaAs), and the upper light guide layer 5 is made of an upper layer AlGaAs/a lower layer GaAs. In the photonic crystal layer (refractive index modulation layer) 6, the base layer 6A is made of GaAs, and the different refractive index region 6B (buried layer) which is buried in the base layer 6A is made of AlGaAs, the upper cladding layer 7 is made of AlGaAs, and the contact layer is made of GaAs.

Note that, as illustrated in FIG. 6, each of the layers is doped with a first conductivity type (N-type) impurity or a second conductivity type (P-type) impurity (impurity concentration is $1 \times 10^{17}$ to $1 \times 10^{21}/cm^3$), and an area which is not doped with any impurity intentionally is an intrinsic (I-type). The concentration of the I-type impurity is $1 \times 10^{15}/cm^3$ or less.

Moreover, an energy band gap of the cladding layer is larger than an energy band gap of the light guide layer, and the energy band gap of the light guide layer is set to be larger than an energy band gap of a well layer of the active layer 4. In AlGaAs, by changing a composition ratio of Al, it is possible to easily change the energy band gap and refractive index. In $Al_XGa_{1-X}As$, when a composition ratio X of Al having a relatively small atomic radius is reduced (increased), the energy band gap having a positive correlation with the Al decreases (increases). When InGaAs is formed by mixing In having a large atomic radius with GaAs, the energy band gap decreases. That is, the Al composition ratio of the cladding layer is larger than the Al composition ratio of the light guide layer, and the Al composition ratio of the light guide layer is equal to or larger than the Al composition of a barrier layer (AlGaAs) of the active layer. The Al composition ratio of the cladding layer is set to 0.2 to 0.4, for example, 0.3. The Al composition ratios of the light guide layer and the active layer are set to 0.1 to 0.15, for example, 0.1.

Also, the thicknesses of the layers are as illustrated in FIG. 6, in which a numerical range represents preferable values, and the numbers in parentheses indicate the optimum values. Incidentally, the photonic crystal layer is configured to change a polarization direction in the XY plane of the unit configuration regions, and also to match phases in respective regions. Since a phase of emitted laser light is dependent on the characteristics of the photonic crystal layer, the photonic crystal layer functions as a phase modulation layer.

Figure 28:
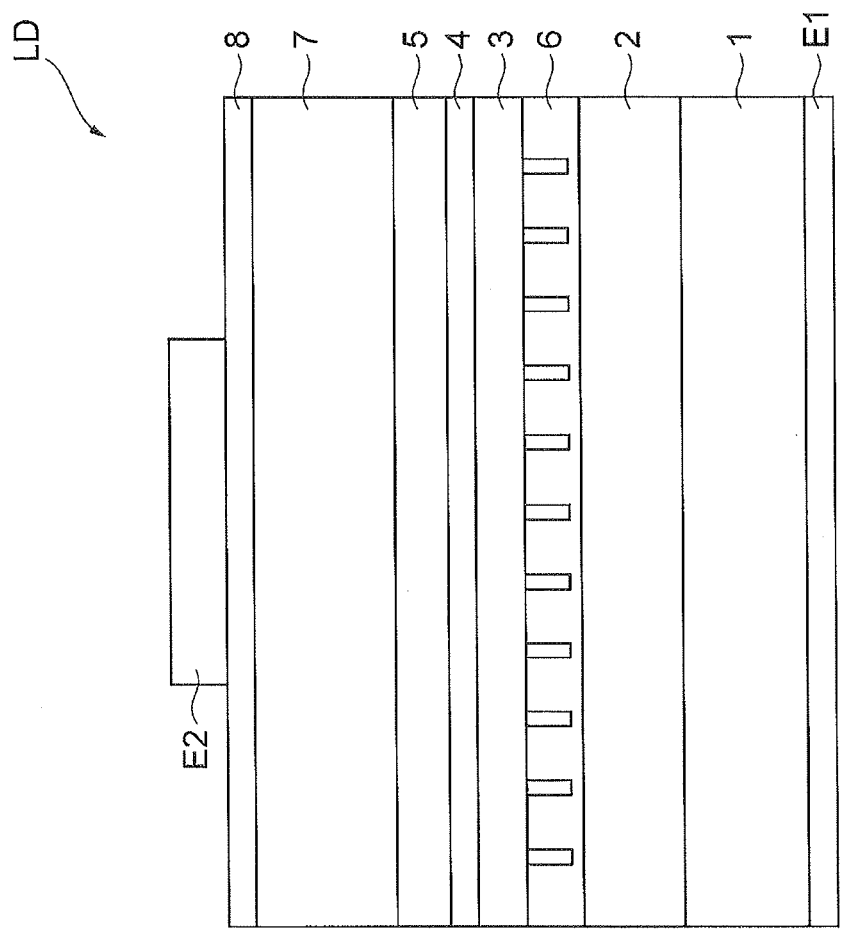
FIG. 28 is a diagram illustrating a longitudinal sectional configuration of a laser element.

As illustrated in FIG. 28, the photonic crystal layer 6 may be provided between the lower cladding layer 2 and the active layer 4. In this case, the photonic crystal layer 6 can be disposed at a position interposed between the lower cladding layer 2 and the light guide layer 3. This structure also achieves the same effect as described above. That is, the laser light emitted from the active layer 4 is incident into the photonic crystal layer 6, forming a predetermined mode. The laser light incident into the photonic crystal layer 6 is emitted as a laser beam in a direction perpendicular to a substrate surface, through the lower light guide layer, the active layer 4, the upper light guide layer 5, the upper cladding layer 7, the contact layer 8, and the upper electrode E2. The laser beam can also be emitted at an angle from the direction perpendicular to the substrate surface.

FIG. 7 is a diagram illustrating a longitudinal sectional configuration of a fourth laser element.

A structure of the laser element LD is substantially similar to that illustrated in FIG. 5, except for a shape of an electrode. That is, a first electrode E1 provided in a lower surface of a semiconductor substrate 1 is an aperture electrode having an aperture in a central portion thereof, and an antireflection film M is provided within and around an aperture of the first electrode E1. The antireflection film M is formed of a dielectric single-layer film, such as silicon nitride (SiN) or silicon dioxide ($SiO_2$), or a dielectric multilayer film. As the dielectric multilayer film, a film can be used, which generated by appropriately laminating two or more dielectric layers selected from a dielectric layer group including, for example, titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminum oxide ($Al_2O_3$), cerium oxide ($CeO_2$), indium oxide ($In_2O_3$), and zirconium oxide ($ZrO_2$). For example, a film having a thickness of $\lambda/4$ as an optical thickness for light with a wavelength $\lambda$ is laminated. In addition, a reflection film or an antireflection film can be formed by sputtering.

A second electrode E2 is provided on an upper surface of a contact layer 8. If required, an insulation film 9 is coated on an area other than an area in which the contact electrode E2 is formed, protecting a rear surface.

In this structure, a lower cladding layer 2, a lower light guide layer 3, an active layer 4, an upper light guide layer 5, a photonic crystal layer 6, an upper cladding layer 7, and the contact layer 8 are sequentially laminated on a semiconductor substrate 1. When a driving current is supplied between the first electrode E1 and the second electrode E2, recombination of electrons and holes occur inside the active layer 4, and therefore, the active layer 4 emits light. A carrier to contribute light emission and generated light are effectively trapped by the upper and lower light guide layers 3 and 5 and the cladding layers 2 and 7 therebetween.

The laser light emitted from the active layer 4 is incident into the photonic crystal layer 6, forming a predetermined mode. In addition, the photonic crystal layer 6 includes a base layer 6A formed of a first refractive index medium and a plurality of different refractive index regions 6B formed of a second refractive index medium having a refractive index different from that of the first refractive index medium and disposed inside the base layer 6A. The plurality of different refractive index regions 6B has a periodic structure. The laser light incident into the photonic crystal layer 6 is emitted to the outside as a laser beam, through the upper light guide layer 5, the active layer 4, the lower light guide layer 3, the lower cladding layer 2, the semiconductor substrate 1, and the antireflection film M. In a lower surface of the semiconductor substrate 1, the first electrode E1 is not provided in an area facing the second electrode E2, and the laser beam LB is emitted to the outside from the lower surface. A different refractive index region 6B may be embedded within holes of the base layer 6A, and thereafter, a modified refractive index coating layer which is formed of the same material as the different refractive index region 6B may be deposited on the base layer 6A.

Figure 8:
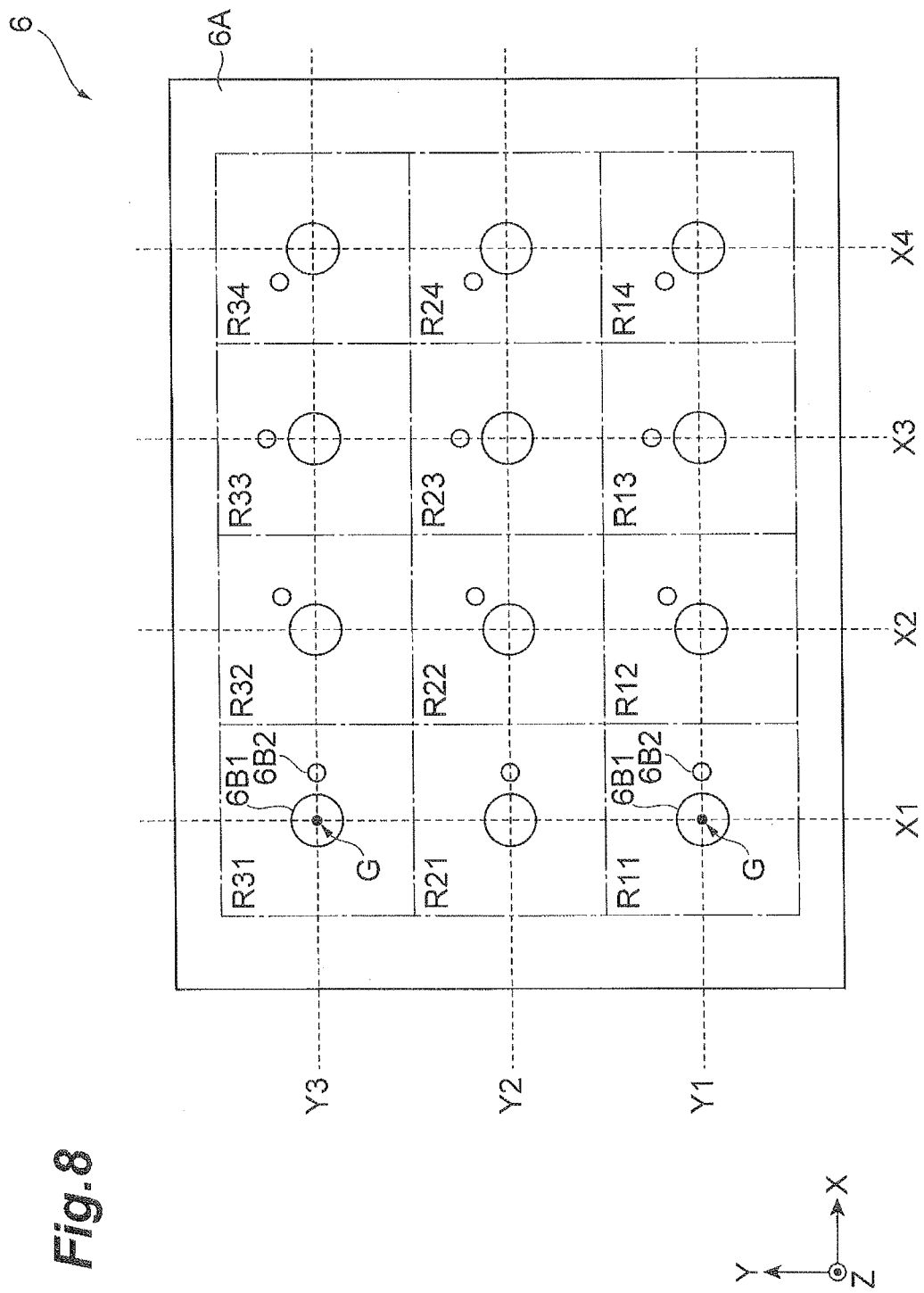
FIG. 8 is a plan view of a photonic crystal layer.

FIG. 8 is a plan view of the aforementioned photonic crystal layer 6.

The photonic crystal layer 6 includes the base layer 6A formed of a first refractive index medium and the different refractive index region 6B formed of a second refractive index medium having a refractive index different from that of the first refractive index medium. The different refractive index region 6B is a compound semiconductor, but may be a hole filled with argon, nitrogen or air.

Each of the plurality of different refractive index regions 6B includes a first different refractive index region 6B1 inside a hole having a planar shape of an approximate circle and a first area (area S1 in the XY plane) perpendicular to a thickness direction (Z axis), and a second different refractive index region 6B2 inside a hole having a second area (area S2 in the XY plane) perpendicular to the thickness direction. The second area S2 is smaller than the first area S1 (S2<S1).

In this case, unit configuration regions R11 to R34 are defined. Each of the unit configuration regions R11 to R34 includes one first different refractive index region 6B1 and one second refractive different refractive index region 6B2 disposed in the vicinity of the first different refractive index region 6B1. In each of the unit configuration regions R11 to R34, a rotational angle of (a center) of the second different refractive index region 6B2 with respect to (a center G) of the first different refractive index region 6B1 is denoted by $\phi$. When the rotational angle $\phi$ is identical to the positive direction of the X axis, $\phi=0°$ is defined.

As illustrated in FIG. 8, in the photonic crystal layer 6, the plurality of unit configuration regions R11 and R34 are two-dimensionally arranged in an XY plane including an X axis and an Y axis, and XY coordinates of the unit configuration regions R11 and R34 are respectively given as central positions G of the first different refractive index regions 6B1. The XY coordinates (coordinates of the center G) of each of the unit configuration regions R11 and R34 are given as (X, Y).

The coordinates of the unit configuration region R11 are (X1, Y1), and the coordinates of the unit configuration region Rmn are (Xm, Yn) (m and n are natural numbers). Referring to FIG. 8, the rotational angle $\phi$ increase at equal intervals in proportion to an increase in coordinate on the X axis in the drawings, but is not changed in spite of a change in coordinate on the Y axis. That is, the rotational angle $\phi$ is a function of x. The function is given as, for example, $\phi=\phi_0+aX$ ($\phi_0$ is an integer and a is an integer other than 0). In a light emitting surface, a polarization modulation pattern according to a position is obtained, but it is possible to allow conversion into an intensity modulation pattern by transmission through a polarizing plate. When the Fourier transformation is performed on the intensity modulation pattern through a convex lens, it is possible to obtain a beam spot having a desired shape. For example, it is possible to convert a shape of the laser beam into a spot (a circle). The function can be applied to all or a specific area of the photonic crystal layer.

FIG. 9 is a diagram for describing an example of a positional relationship of different refractive index regions. In FIG. 9, when the aforementioned center G is set as the origin in a unit configuration region, an x axis and a y axis parallel to the X axis and the Y axis are set.

FIG. 9(A) illustrates the case of $\phi=0$ (rad), FIG. 9(B) illustrates the case of $\phi=0.25\pi$ (rad), FIG. 9(C) illustrates the case of $\phi=0.5\pi$ (rad), FIG. 9(D) illustrates the case of $\phi=0.75\pi$ (rad), FIG. 9(E) illustrates the case of $\phi=\pi$ (rad), and FIG. 9(F) illustrates the case of $\phi=1.7\pi$ (rad).

Figure 10:
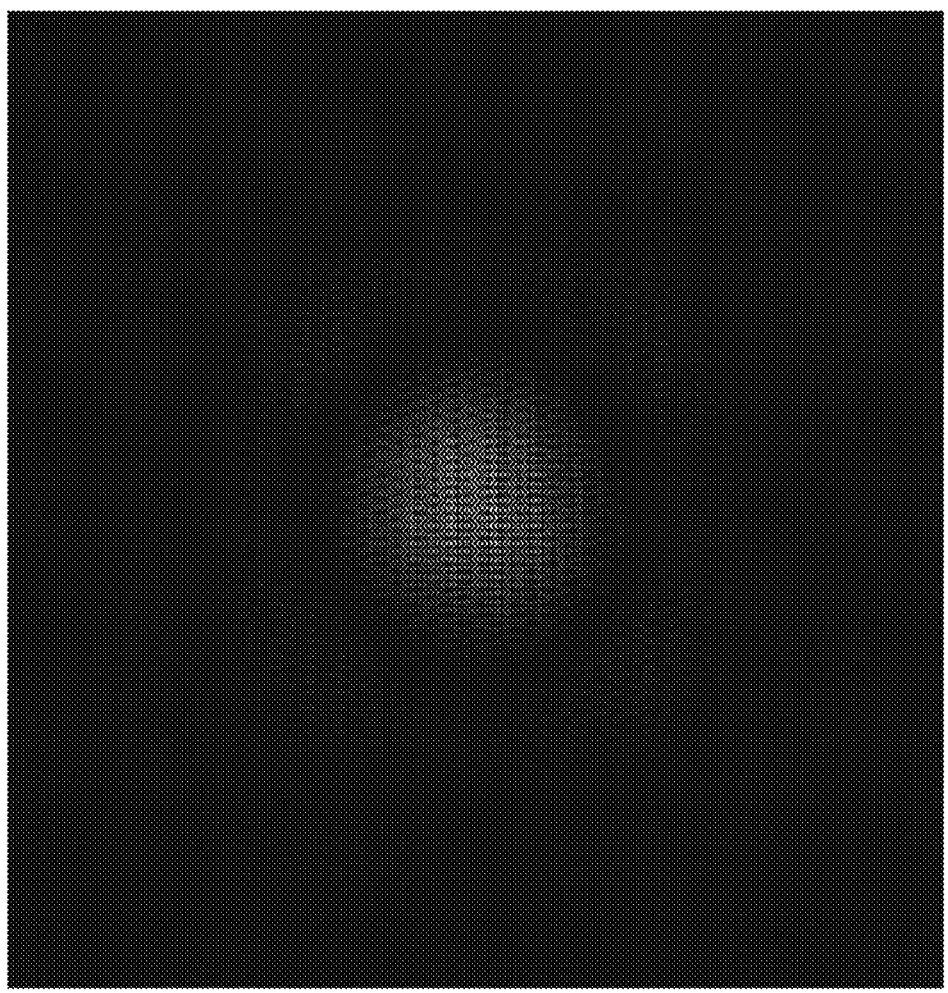
FIG. 10 is a diagram illustrating an intensity distribution pattern of emission light.
Figure 11:
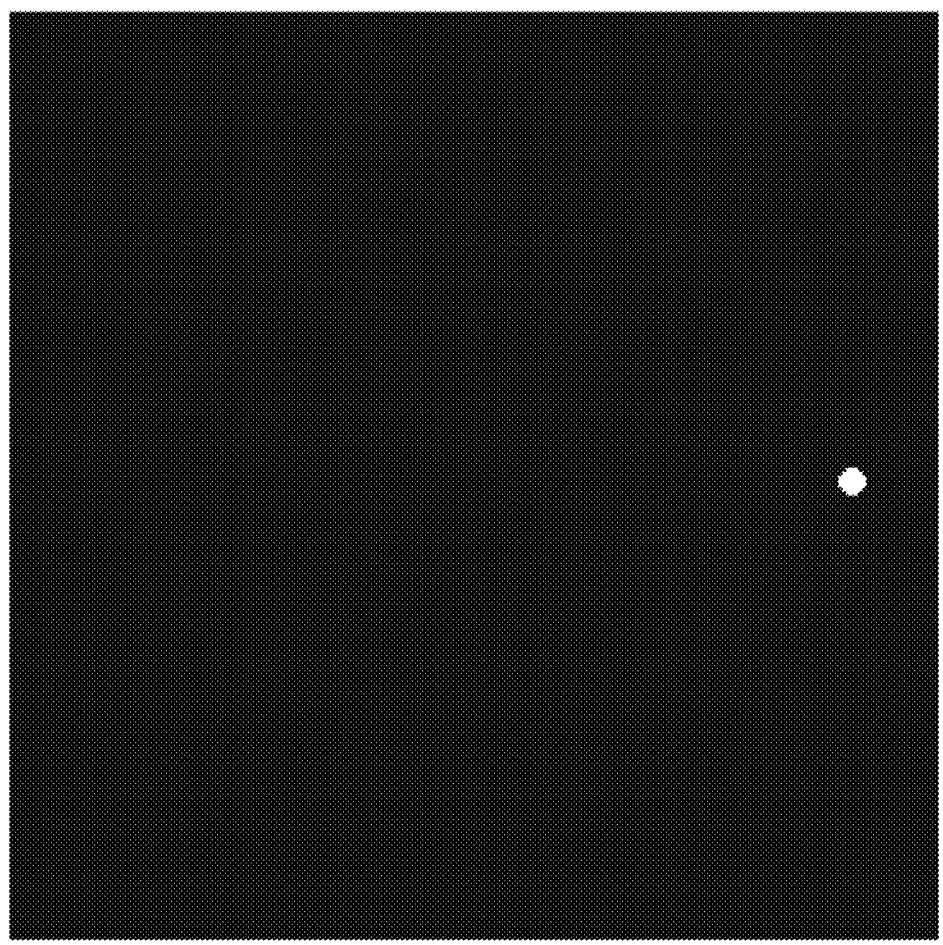
FIG. 11 is a far-field image after the Fourier transformation.

FIG. 10 is a diagram illustrating an intensity distribution pattern of an emission light after passing through a polarizing plate P (FIG. 33). In FIG. 10, colors represent intensity distribution (corresponding to $\phi$) of laser light at each position (coordinates) and intensities of 0 to the maximum correspond to black to white. In addition, an intensity corresponds to a polarizing direction. In this case, a shape or far-field image of the laser beam after passing through a lens or a hologram are as illustrated in, for example, FIG. 11. A center of FIG. 10 corresponds to a plane perpendicular direction of a device, that is a direction perpendicular to the photonic crystal layer. A white portion corresponds to a shape of laser beam. In this case, the shape of the laser beam is a spot (circle).

FIG. 12 is a diagram illustrating a positional relationship between different refractive index regions and an electric field distribution.

FIG. 12 illustrates plane states of four unit configuration regions R11, R12, R21, and R22 which are adjacent to one another. A mode in which an electric field is distributed so as to surround the first different refractive index region 6B 1 by laser light is generated inside the photonic crystal layer 6. There has been known the fact that, on condition that a lattice interval is almost identical to a wavelength in a structure in which the first different refractive index regions 6B1 are arranged in a square lattice shape, four types of modes are generated from their symmetry. Since the four types of modes have different frequencies, the mode in which the electronic field is distributed so as to surround the first different refractive index region 6B 1 as described above, by appropriately selecting a frequency of light incident to the photonic crystal layer. In this mode, an electronic field vector indicated by an arrow is disposed so as to be rotated with respect to the center G. A square is configured by making the central position of the electric field vector coincident with the central position G of the first different refractive index region 6B 1 and forming a line connecting the central positions G of four first different refractive index regions 6B 1. That is, the first different refractive index regions 6B1 are disposed at lattice point positions of a square lattice. An electric field vector also exists which rotates around a intersecting point of diagonal lines of the configured square.

When a fine second different refractive index region 6B2 is located in each of the unit configuration regions, only the electric field vector at a corresponding position effectively remains and works and the remaining electric field vector is likely to be offset. According to the boundary conditions of Maxwell's equations, an electric field component in the XY plane varies depending on a difference in dielectric constant between inner and outer areas of a refractive index boundary. As a result, the electric field vector at a position of the rotational angle $\phi$ (polarization direction) is only left as a point light source of linear polarization. In order words, it can be considered that a plurality of point light sources is distributed which have different polarization directions in a two-dimensional plane on the photonic crystal layer 6. In addition, it can be considered that a far-field image of distribution of the point light sources is obtained by performing Fourier transformation on the point light sources.

Figure 13:
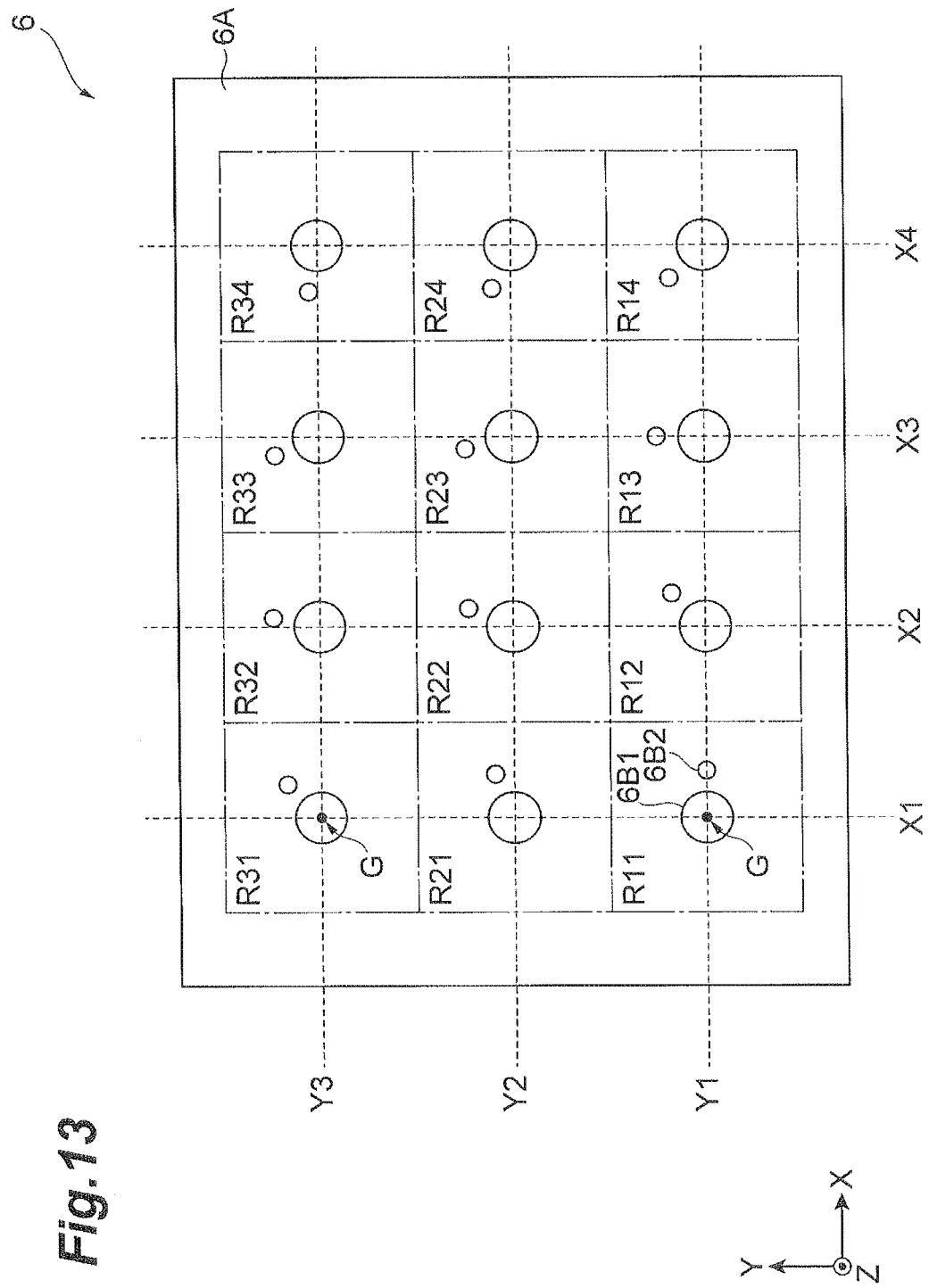
FIG. 13 is a plan view of a photonic crystal layer.

FIG. 13 is a plan view of a photonic crystal layer.

What is illustrated in FIG. 13 differs from what is illustrated in FIG. 8 in that $\phi$ is a function of Y as well as a function of X. That is, $\phi$ increases at equal intervals in proportion to an increase in X, and $\phi$ also increases at equal intervals in proportion to an increase in Y. The function is given as $\phi=\phi_0+aX+bY$ ($\phi_0$ is an integer, a is an integer other than 0, and b is an integer other than 0). In this case, it is possible to obtain a different laser beam pattern from the aforementioned laser beam pattern. The function can be applied to all or a specific area of the photonic crystal layer.

Figure 14:
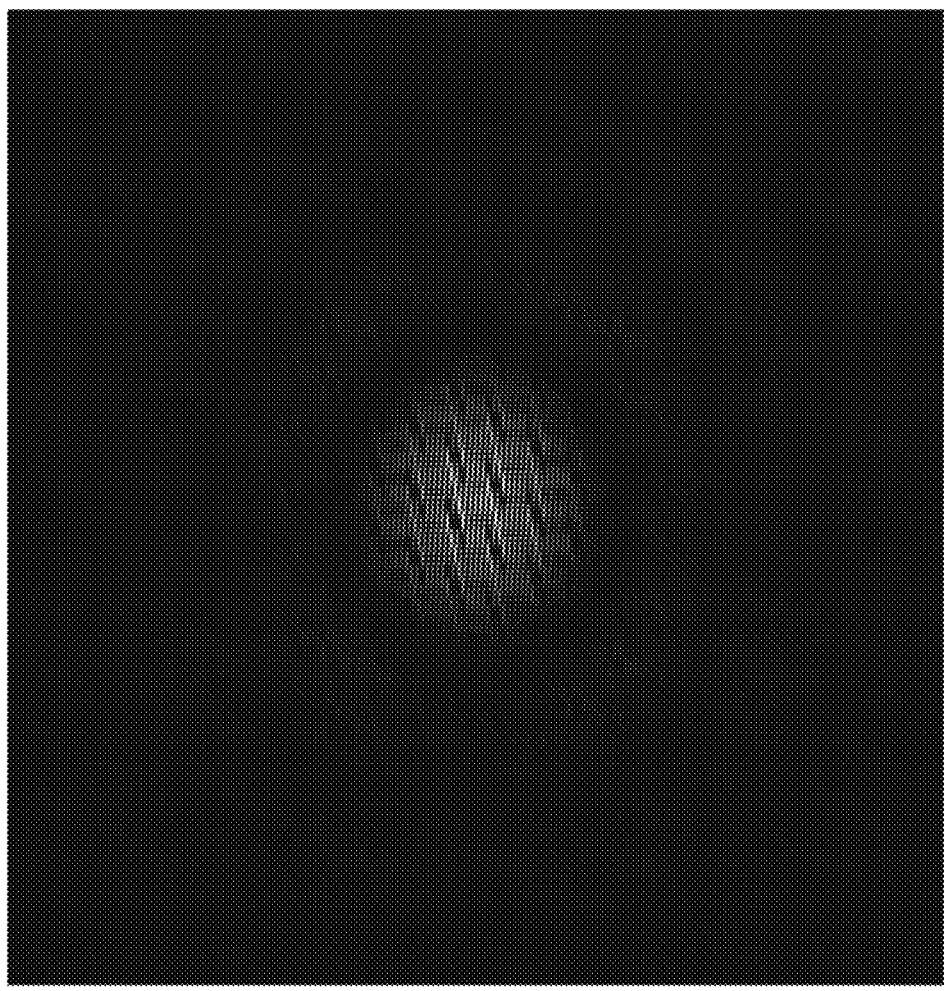
FIG. 14 is a diagram illustrating an intensity distribution pattern of emission light.

FIG. 14 is a diagram illustrating an intensity distribution pattern of emission light after passing through a polarizing plate.

Figure 15:
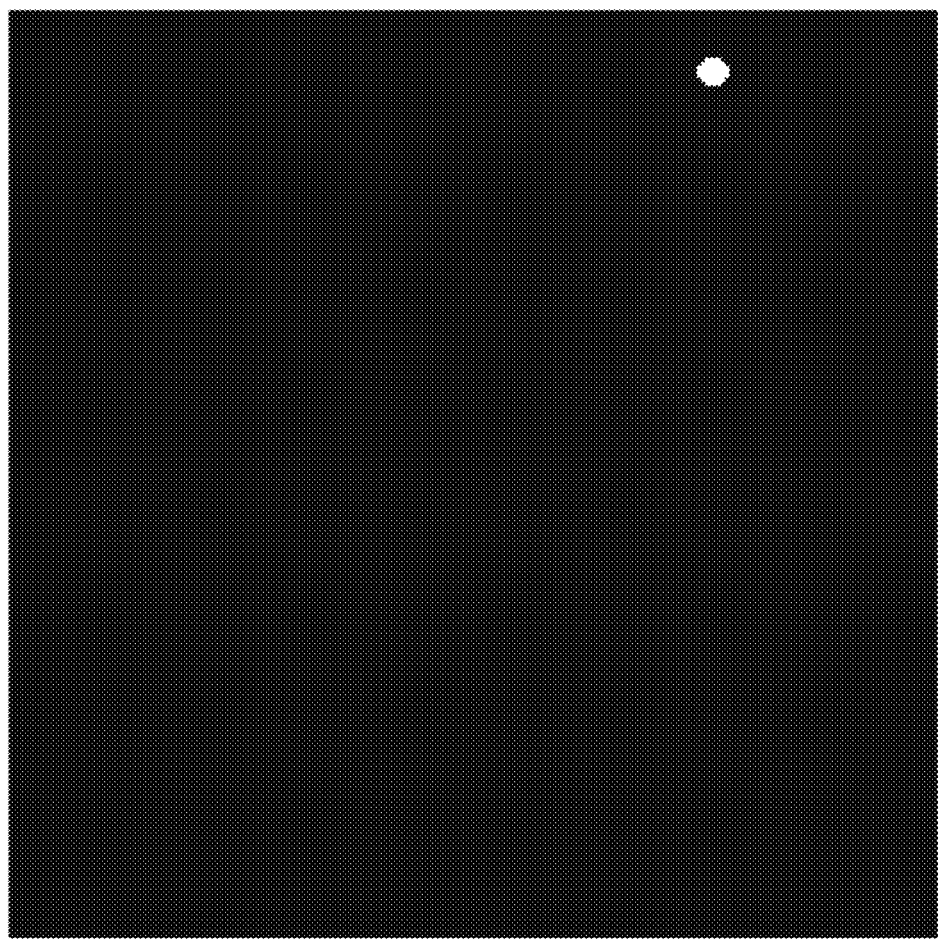
FIG. 15 is a far-field image after the Fourier transformation.

In FIG. 14, colors represent intensity distribution (corresponding to $\phi$) of laser light at each position (coordinates) and intensities of 0 to the maximum correspond to black to white. In this case, a shape or far-field image of the laser beam after passing through a lens or a hologram are as illustrated in, for example, FIG. 15. A center of FIG. 14 corresponds to a position extending from a center of a light emitting surface of a device in a vertical direction, that is, a position extending from a center of the photonic crystal layer in a vertical direction. A white portion corresponds to a shape of a laser beam. In this case, the shape of the laser beam is a spot (circle).

In addition, it is possible to realize a certain intensity distribution by using a method according to the present invention. In other words, it is possible to realize a collection of point light sources, having a certain intensity distribution. Since a far-field image obtained from the collection of point light sources is obtained by performing Fourier transformation on an intensity distribution of the point light sources, a certain far-field image can be obtained if a certain intensity distribution is realized. Specifically, when the intensity distribution obtained by performing Fourier transformation on a desired far-field image is arranged according to a method of the present invention, a certain far-field image can be obtained. Examples of an intensity distribution pattern will be described below.

Figure 16:
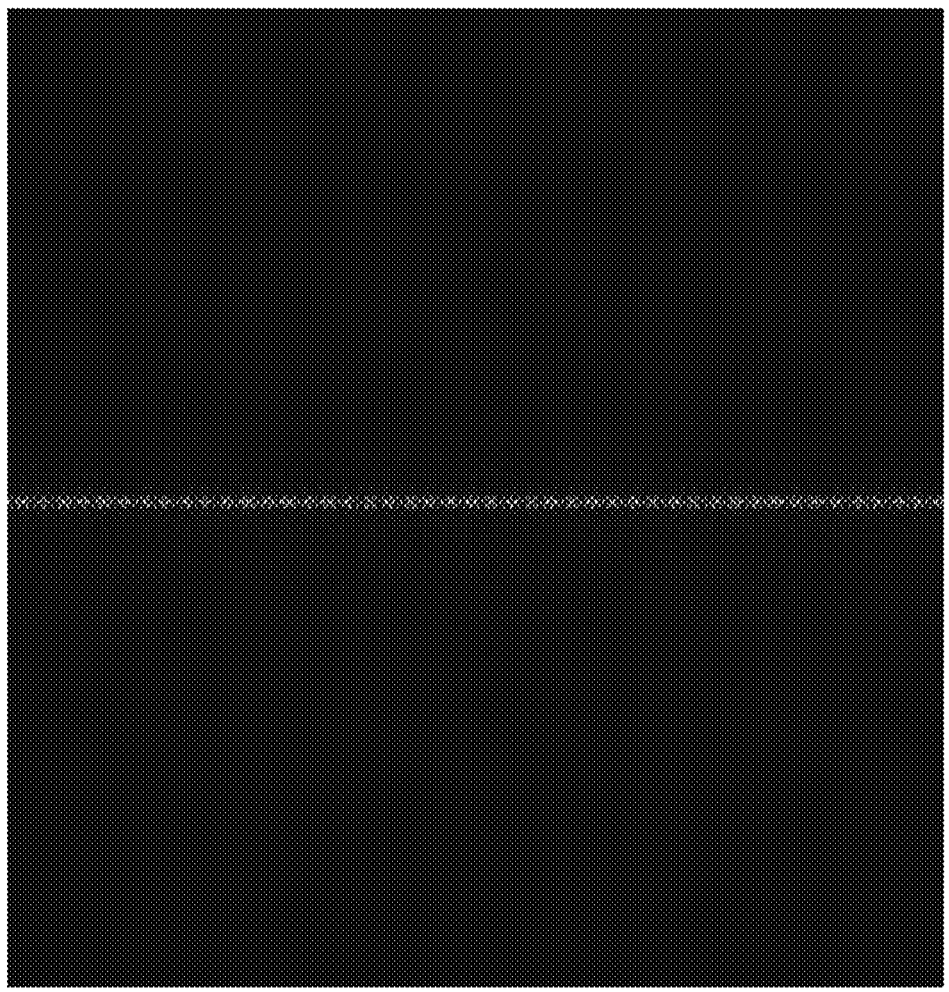
FIG. 16 is a diagram illustrating an intensity distribution pattern of emission light.

FIG. 16 is a diagram illustrating an intensity distribution pattern of emission light.

Figure 17:
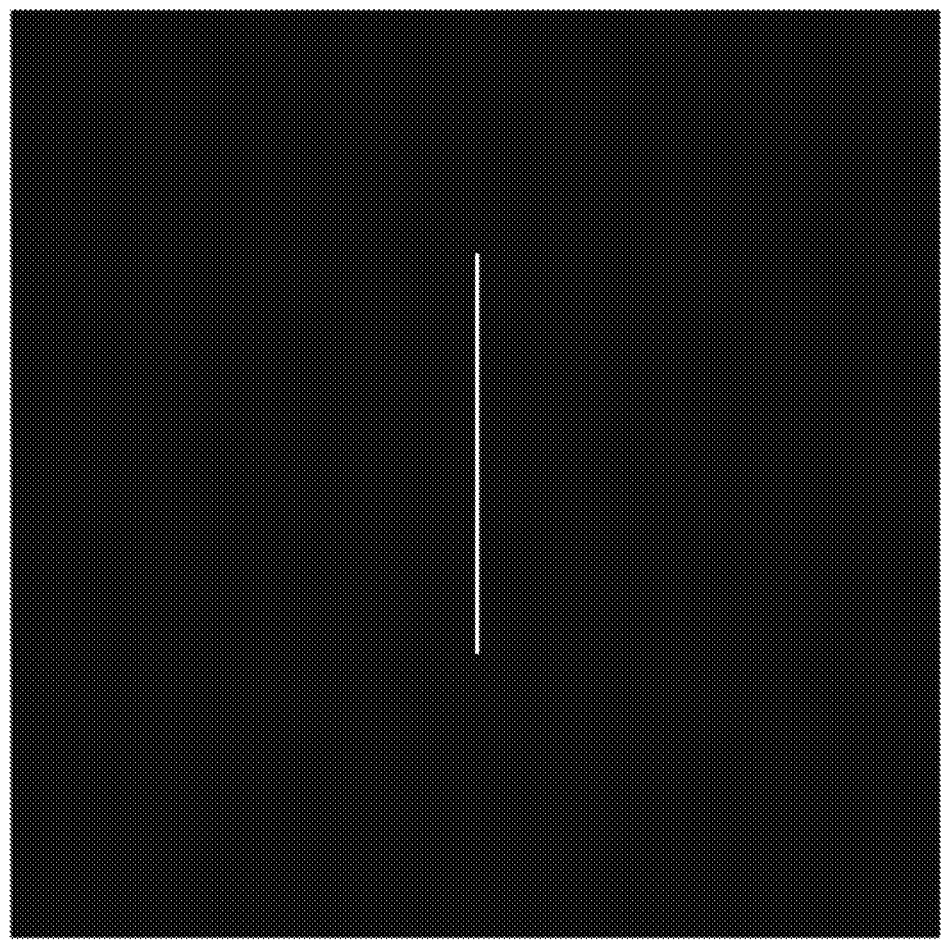
FIG. 17 is a far-field image after the Fourier transformation.

In FIG. 16, colors represent intensity distribution (corresponding to $\phi$) of laser light at each position (coordinates) and intensities of 0 to the maximum correspond to black to white. In this case, a shape or far-field image of the laser beam after passing through a lens or a hologram are as illustrated in, for example, FIG. 17. A center of FIG. 16 corresponds to a position extending from a center of a light emitting surface of a device in a vertical direction, that is, a position extending from a center of the photonic crystal layer in a vertical direction. A white portion corresponds to a shape of a laser beam. In this case, it is possible to obtain a laser beam having a line pattern along a Y axis direction.

Figure 18:
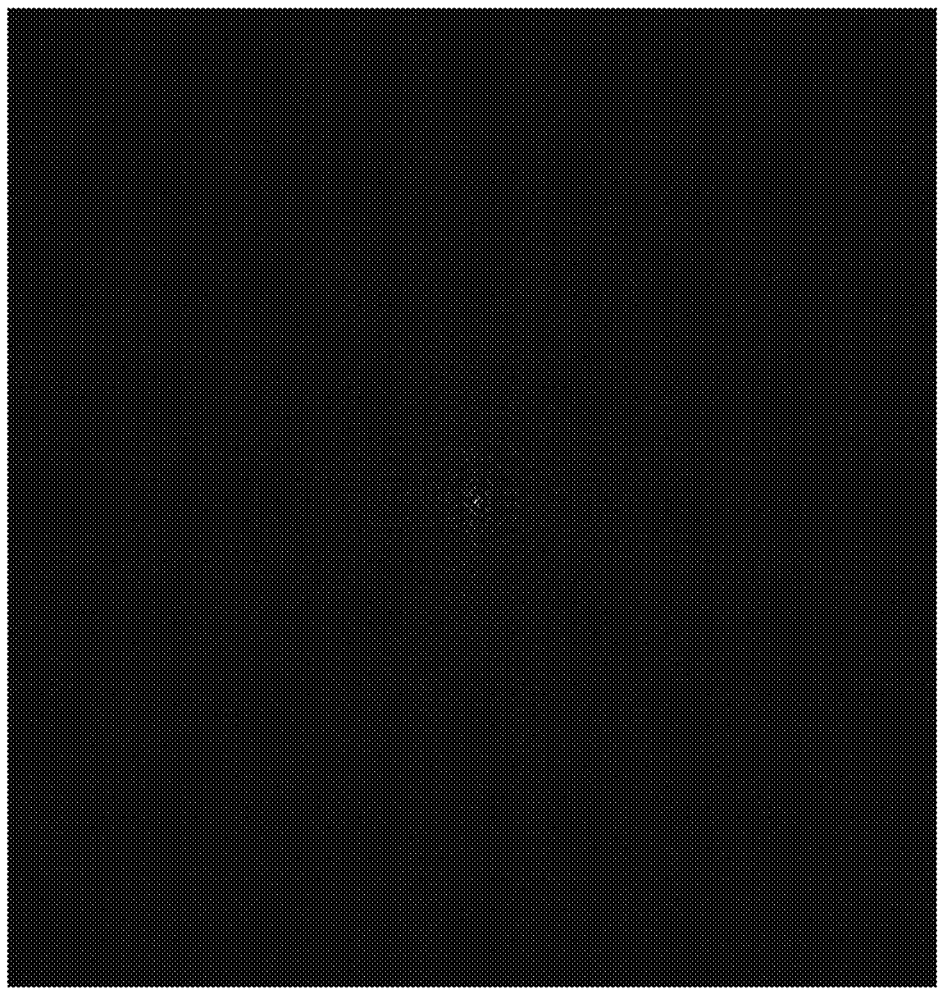
FIG. 18 is a diagram illustrating an intensity distribution pattern of emission light.

FIG. 18 is a diagram illustrating an intensity distribution pattern of emission light.

Figure 19:
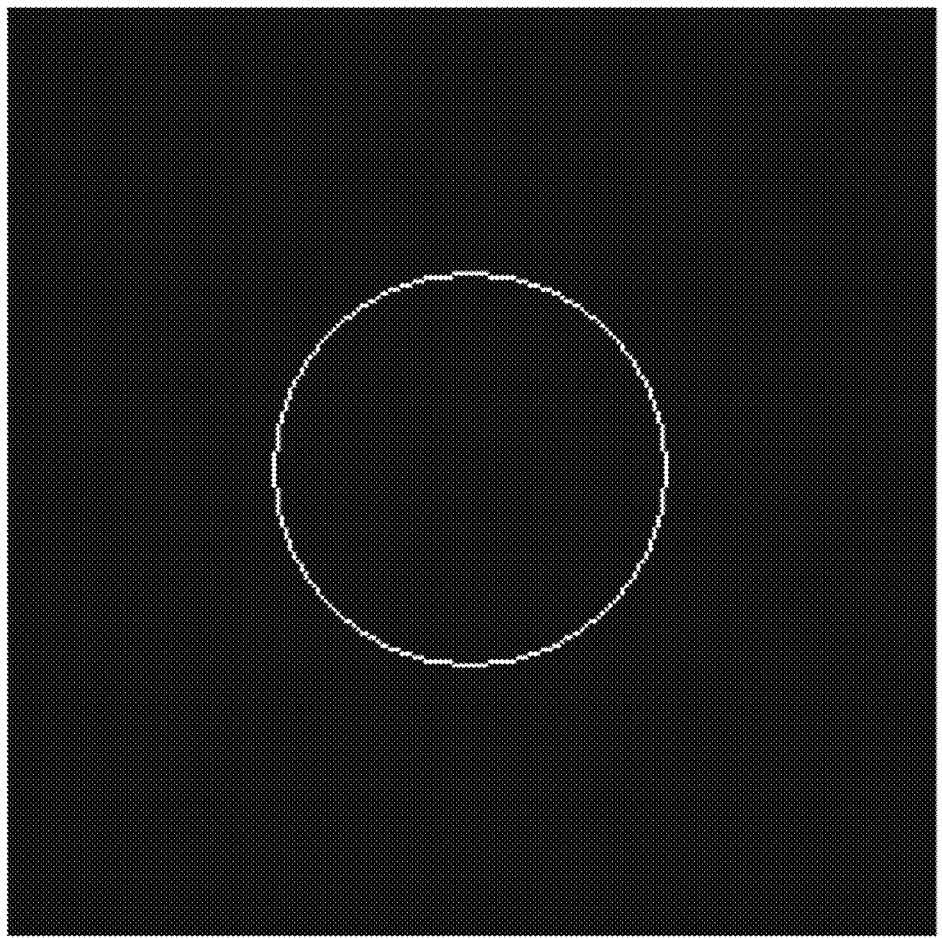
FIG. 19 is a far-field image after the Fourier transformation.

In FIG. 18, colors represent intensity distribution (corresponding to $\phi$) of laser light at each position (coordinates)

and intensities of 0 to the maximum correspond to black to white. In this case, a shape or far-field image of the laser beam after passing through a lens or a hologram are as illustrated in, for example, FIG. 19. A center of FIG. 18 corresponds to a position extending from a center of a light emitting surface of a device in a vertical direction, that is, a position extending from a center of the photonic crystal layer in a vertical direction. A white portion corresponds to a shape of a laser beam. In this case, it is possible to obtain laser beam with an annular pattern.

Figure 20:
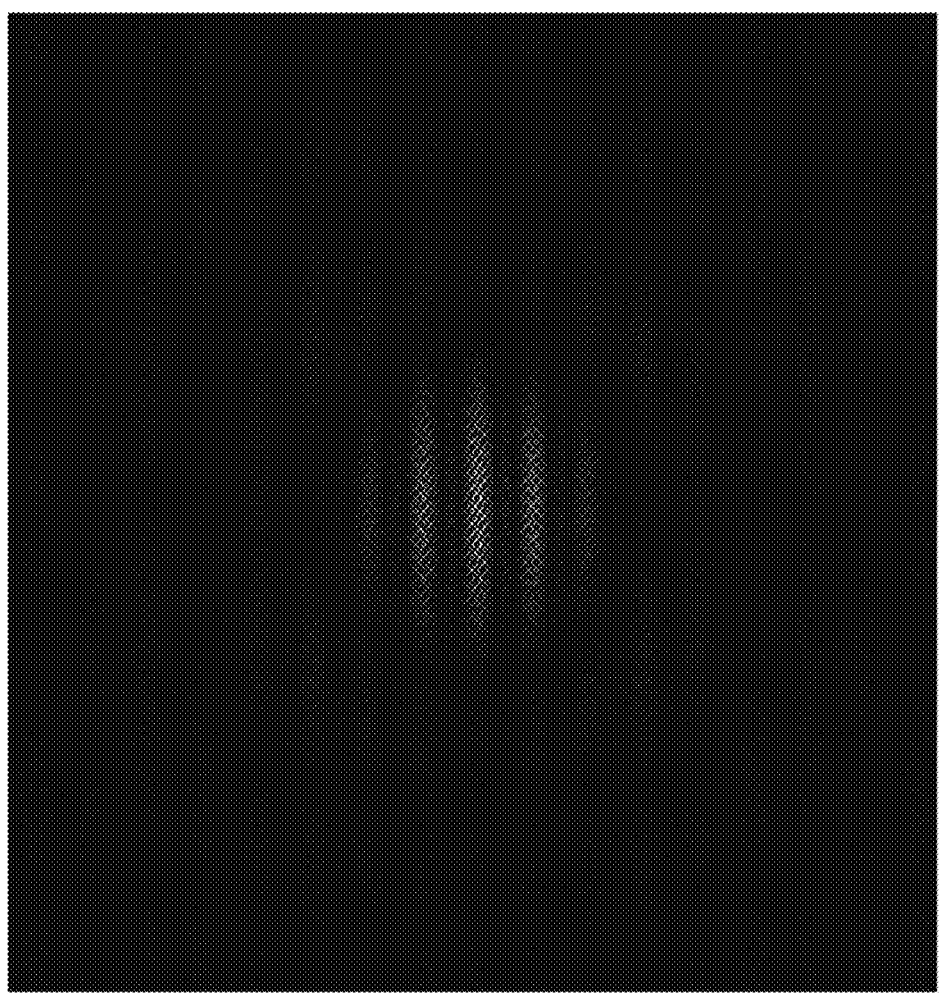
FIG. 20 is a diagram illustrating an intensity distribution pattern of emission light.

FIG. 20 is a diagram illustrating an intensity distribution pattern of emission light.

Figure 21:
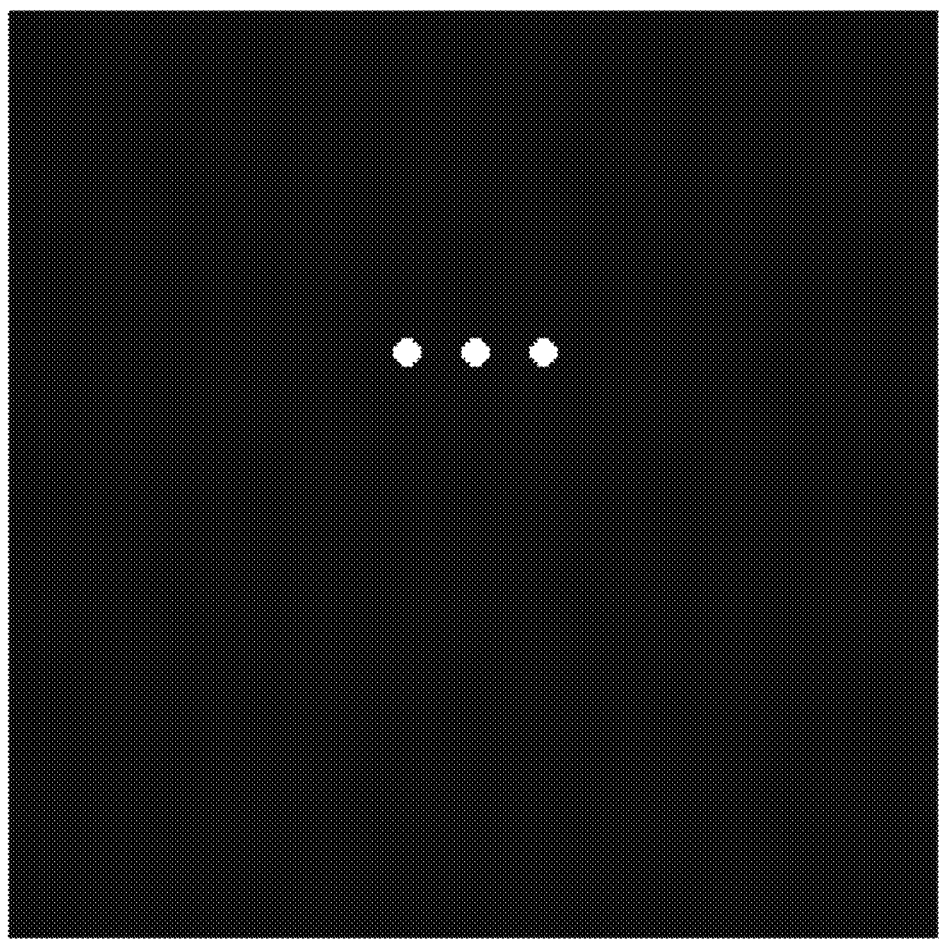
FIG. 21 is a far-field image after the Fourier transformation.

In FIG. 20, colors represent intensity distribution (corresponding to $\phi$) of laser light at each position (coordinates) and intensities of 0 to the maximum correspond to black to white. In this case, a shape or far-field image of the laser beam after passing through a lens or a hologram are as illustrated in, for example, FIG. 21. A center of FIG. 20 corresponds to a position extending from a center of a light emitting surface of a device in a vertical direction, that is, a position extending from a center of the photonic crystal layer in a vertical direction. A white portion corresponds to a shape of a laser beam. In this case, it is possible to obtain a three-point multi-spot laser beam.

Figure 22:
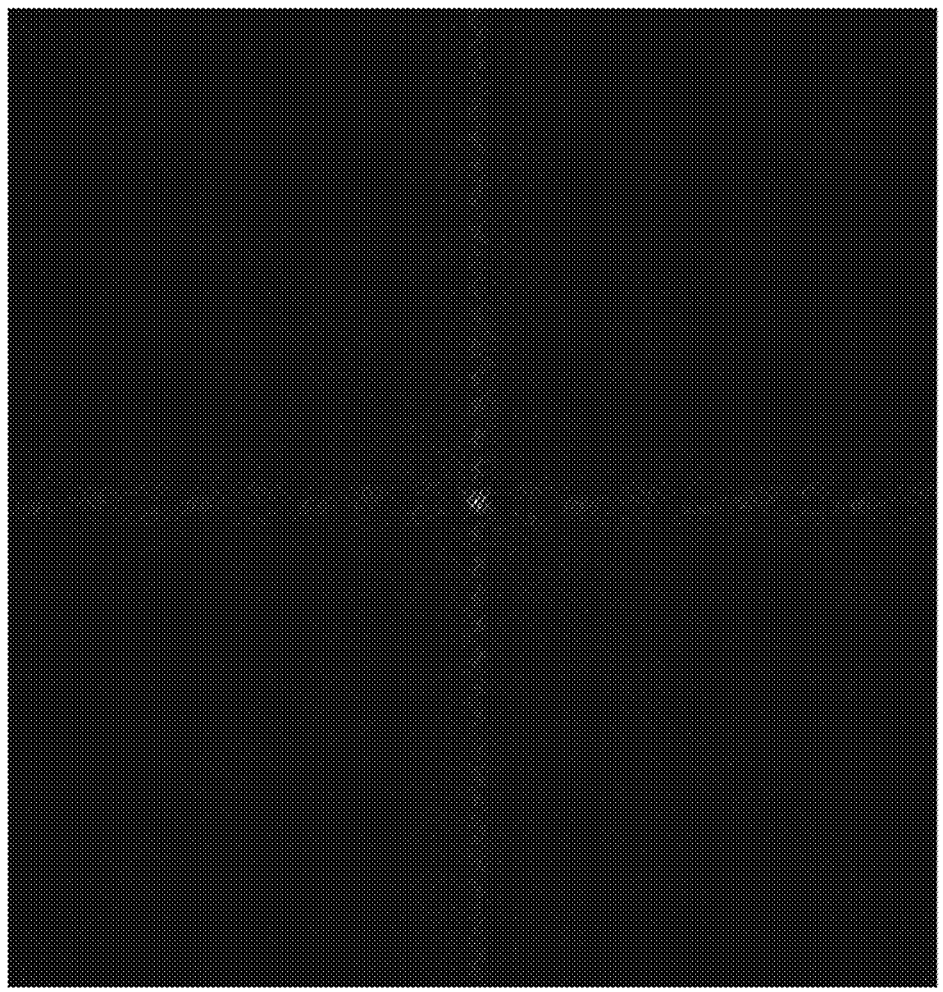
FIG. 22 is a diagram illustrating an intensity distribution pattern of emission light.

FIG. 22 is a diagram illustrating an intensity distribution pattern of emission light.

Figure 23:
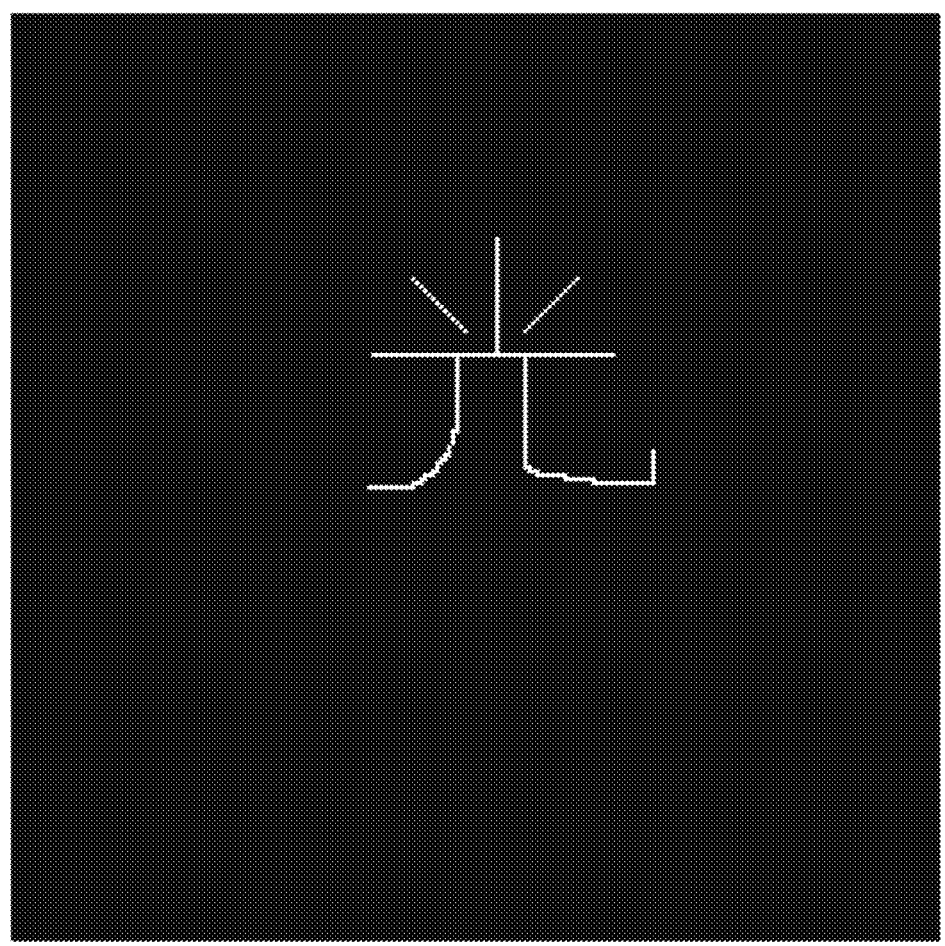
FIG. 23 is a far-field image after the Fourier transformation.

In FIG. 22, colors represent intensity distribution (corresponding to $\phi$) of laser light at each position (coordinates) and intensities of 0 to the maximum correspond to black to white. In this case, a shape or far-field image of the laser beam after passing through a lens or a hologram are as illustrated in, for example, FIG. 23. A center of FIG. 22 corresponds to a position extending from a center of a light emitting surface of a device in a vertical direction, that is, a position extending from a center of the photonic crystal layer in a vertical direction. A white portion corresponds to a shape of a laser beam. In this case, it is possible to obtain a laser beam with a character shape of "光 (light)".

Figure 24:
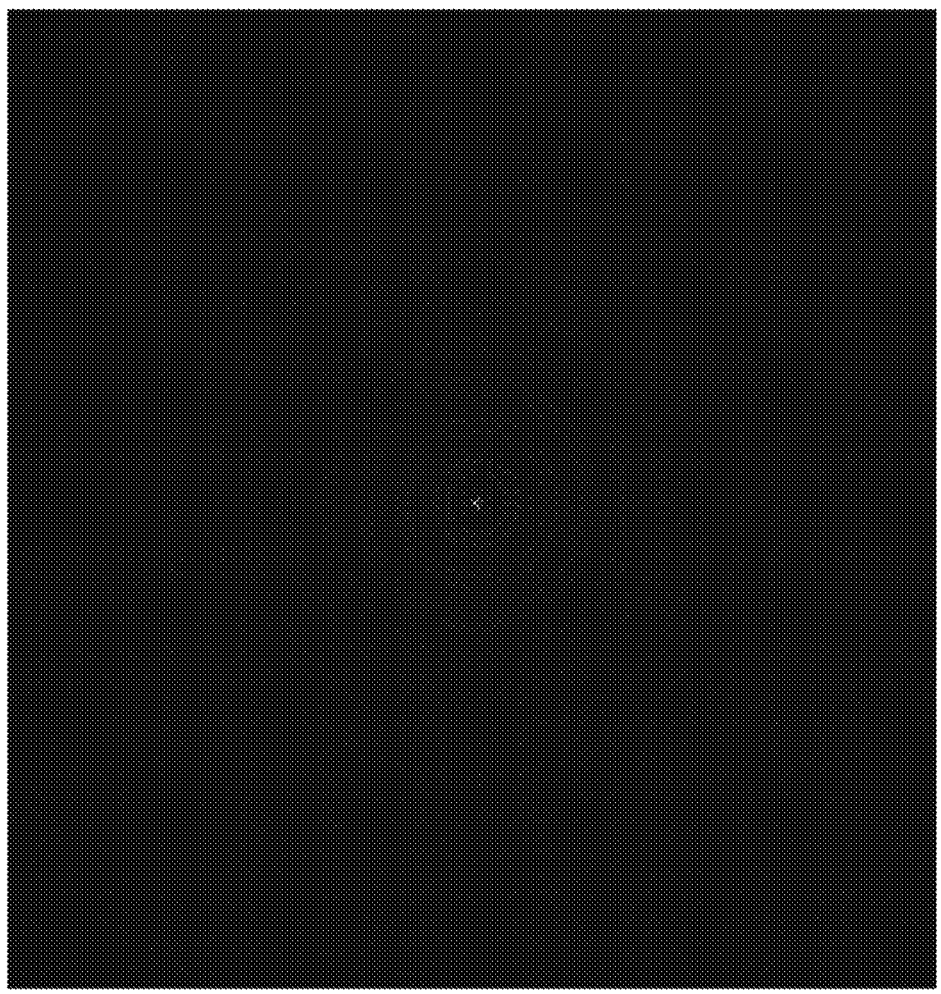
FIG. 24 is a diagram illustrating an intensity distribution pattern of emission light.

FIG. 24 is a diagram illustrating an intensity distribution pattern of emission light.

Figure 25:
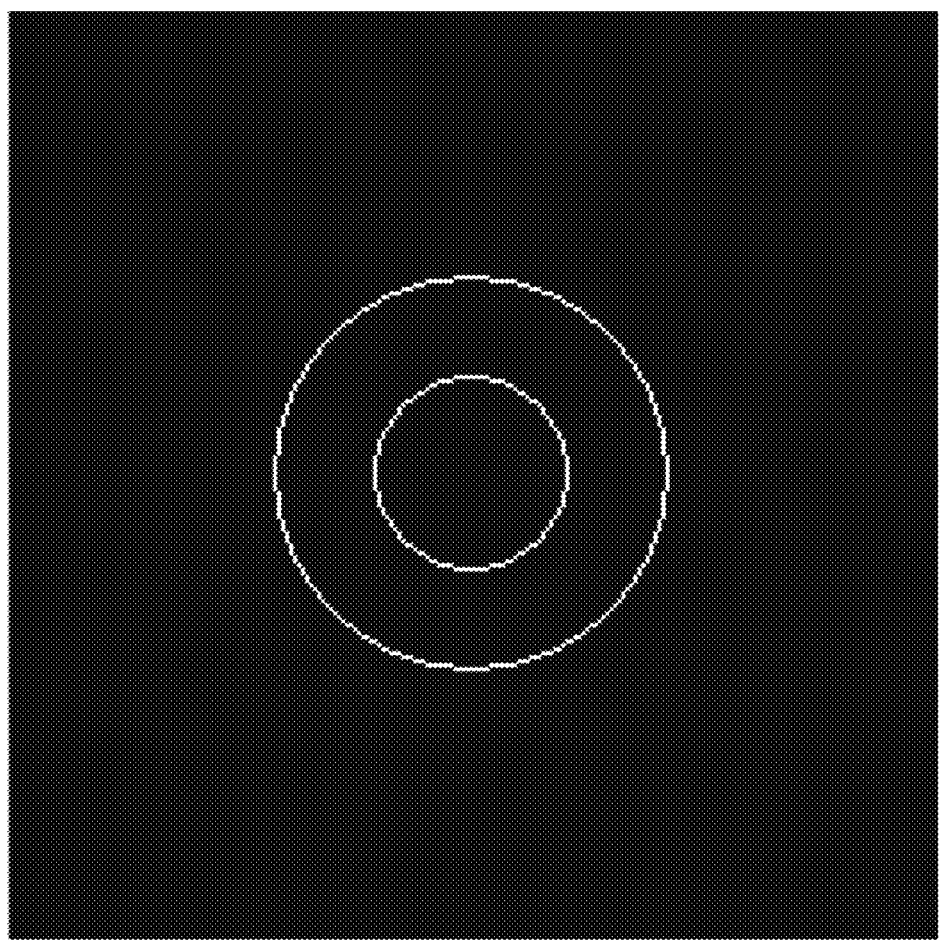
FIG. 25 is a far-field image after the Fourier transformation.

In FIG. 24, colors represent intensity distribution (corresponding to $\phi$) of laser light at each position (coordinates) and intensities of 0 to the maximum correspond to black to white. In this case, a shape or far-field image of the laser beam after passing through a lens or a hologram are as illustrated in, for example, FIG. 25. A center of FIG. 24 corresponds to a position extending from a center of a light emitting surface of a device in a vertical direction, that is, a position extending from a center of the photonic crystal layer in a vertical direction. A white portion corresponds to a shape of a laser beam. In this case, it is possible to obtain a double-annular laser beam.

Figure 26:
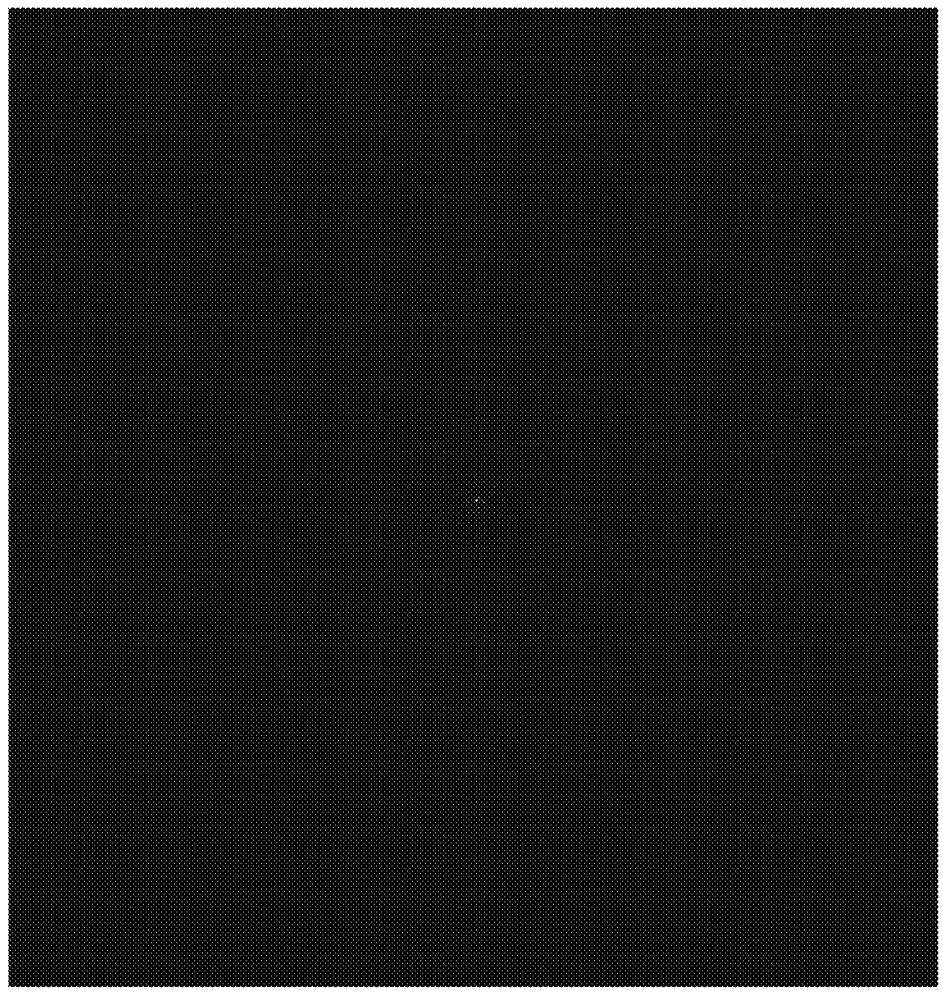
FIG. 26 is a diagram illustrating an intensity distribution pattern of emission light.

FIG. 26 is a diagram illustrating an intensity distribution pattern of emission light.

Figure 27:
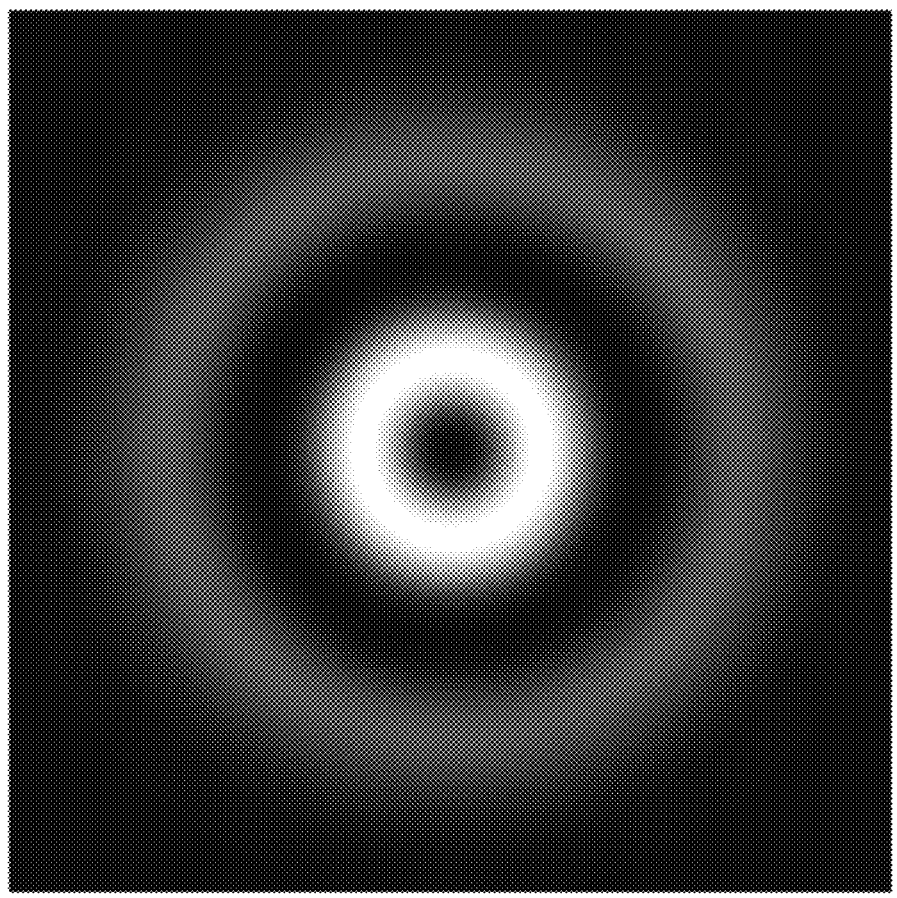
FIG. 27 is a far-field image after the Fourier transformation.

In FIG. 26, colors represent intensity distribution (corresponding to $\phi$) of laser light at each position (coordinates) and intensities of 0 to the maximum correspond to black to white. In this case, a shape or far-field image of the laser beam after passing through a lens or a hologram are as illustrated in, for example, FIG. 27. A center of FIG. 26 corresponds to a position extending from a center of a light emitting surface of a device in a vertical direction, that is, a position extending from a center of the photonic crystal layer in a vertical direction. A white portion corresponds to a shape of a laser beam. In this case, it is possible to obtain a vector beam called a Laguerre-Gaussian beam.

As described above, a far-field image after Fourier transformation of a laser beam can have various shapes, such as a single- or multiple-spot shape, an annular shape, a linear shape, a character shape, a double-annular shape, or a Laguerre-Gaussian beam shape.

As described above, in the case of the aforementioned structure, in the laser light from the respective second different refractive index regions 6B2, since the rotational angle $\phi$ is a function of coordinates, when spatial coordinates are different from each other, polarization directions of respective laser light (intensity after passing through the polarizing plate) become different from each other. Therefore, it is possible to consider each of the second different refractive index regions 6B2 as a point light source, and it is possible to change its intensity for each coordinate according to a position of the rotational angle cp. When it is possible to adjust the intensity of each of point light sources which are two-dimensionally distributed, it is possible to emit various laser beam patterns.

As described above, a far-field image of a point light source group which is two-dimensionally distributed can be considered as a Fourier transformation image of a point light source group. In the case of configuring a circular laser beam spot by Fourier transformation, an intensity of each point light source may be set by performing circle inverse-Fourier transformation at a specific position. That is, when each rotational angle $\phi$ is correspondingly set to an intensity of each point light source in case of performing the circle inverse-Fourier transformation at the specific position, it is possible to obtain a circle laser beam spot at the specific position. In order words, it is possible to obtain a spot having a unimodal two-dimensional intensity distribution at a position in an oblique direction.

Also, laser beam emission angles are different, and the aforementioned laser device includes any of the above plurality of laser elements, which are one- or two-dimensionally arranged, and a driving circuit that drives the laser element, and outputs a laser beam in a plurality of directions. The device can function as a pseudo laser beam scanning device.

Although each of the different refractive index regions 6B1 and 6B2 has an approximate circle in the above case, each of the different refractive index regions 6B1 and 6B2 may have an approximate square or an approximate polygon having a rotational symmetry of 90°. Since the different refractive index regions 6B2 performs its own function although the point symmetry of a shape thereof is somewhat low, the different refractive index regions 6B2 may not have an approximate circle, an approximate square, or an approximate polygon having a rotational symmetry of 90°. In addition, the approximate circle, the approximate square, or the approximate polygon having a rotational symmetry of 90° are designed to have a circle, a square, or a polygon having a rotational symmetry of 90°, but are intended to include shapes which are distorted little upon manufacture.

Among the aforementioned structures, the structure including the active layer 4 and the photonic crystal layer 6 has freedom in a material system, a thickness, a layer configuration. When the laser element is manufactured, each compound semiconductor layer is manufactured by a metal organic chemical vapor deposition (MOCVD). Crystal growth is performed on a (001) plane of the semiconductor substrate 1 but the present invention is not limited thereto. When a laser element is manufactured by using the aforementioned AlGaN, a growth temperature of AlGaAs is in a range of 500° C. to 850° C., and upon experiment, a temperature of 550° C. to 700° C. is used. Upon growth, TMA (trimethyl aluminum) is used as an Al raw material, TMG (trimethyl gallium) and TEG (triethyl gallium) are used as a gallium raw material, $AsH_3$ (arsine) is used as an As raw material, $Si_2H_6$ (disilane) is used as a raw material for N-type impurity, and DEZn (diethyl zinc) is used as a raw material for P-type impurity. In GaAs growth, TMG and arsine are used, but TMA is not used. InGaAs is manufactured by using TMG, TMI (trimethyl indium), and arsine. Formation of an insulation film may be formed by performing sputtering on a target using its composition materials as raw materials.

That is, the aforementioned laser element is manufactured by sequentially and epitaxially growing, on an N-type semiconductor substrate (GaAs) 1, an N-type cladding layer (AlGaAs) 2, a guide layer (AlGaAs) 3, a multiple quantum well structure (InGaAs/AlGaAs) 4, a light guide layer (GaAs/AaGaAs) 5, a base layer (GaAs) 6A using MOCVD (metal organic chemical vapor deposition). Subsequently, in order to make an alignment after the epitaxial growth, an SiN layer is formed on the base layer 6A and then, a resist is formed on the SiN layer, by the PCVD (plasma CVD) method. Furthermore, the resist is exposed and developed, and the SiN layer is etched using the resist as a mask, causing the SiN layer to be partially left to form an alignment mark. Remaining resist is removed.

Next, a separate resist is coated on the base layer 6A, and a two-dimensional fine pattern is drawn on the resist using an alignment mark as a reference by an electron beam drawing device and is developed, forming the two-dimensional fine pattern on the resist. Thereafter, the two-dimensional fine pattern having a depth of about 100 nm is transferred onto the base layer 6A by dry etching using the resist as a mask to form a hole (bore) and the resist is removed. The depth of the hole is 100 nm. A compound semiconductor which becomes the different refractive index region 6B (AlGaAs) is regrown within the hole to more than the depth of the hole. An upper cladding layer (AlGaAs) 7 and a contact layer (GaAs) 8 are sequentially formed by MOCVD, and appropriate electrode material is formed on upper and lower surfaces of the substrate by a deposition method or a sputtering method, forming first and second electrodes. Also, if required, it is possible to form an insulation film on the upper and lower surfaces of the substrate by a sputtering method or the like.

When the photonic crystal layer is deposited under the active layer, the photonic crystal layer may be formed on the lower cladding layer before formation of the active layer and the lower light guide layer.

In the case of manufacturing a laser element body including no photonic crystal layer, this manufacturing process may be omitted. Also, a columnar different refractive index region air may be made as a cavity, and air or a gas such as nitrogen or argon may be filled therein. Also, in the aforementioned square lattice, an interval between vertical and horizontal lattice lines is approximately obtained by dividing a wavelength by an equivalent refractive index, and specifically, it is preferable to be set to about 300 nm. It is also possible to arrange the first different refractive index region at a lattice point position in a triangular lattice, rather than a lattice point position in a square lattice. In the case of the triangular lattice, an interval between horizontal and oblique lattice lines is approximately obtained by dividing a wavelength by an equivalent refractive index and also dividing the wavelength by Sin 60°, and specifically, it is preferable to be set to about 350 nm.

In the case of a square lattice having a lattice interval a, when the unit vectors of orthogonal coordinates are set to x and y, fundamental translation vectors are $a_1=ax$, $a_2=ay$, and the reciprocal lattice fundamental vectors for the translation vectors $a_1$ and $a_2$ are $b_1=(2\pi/a) y$ and $b_2=(2\pi/a) x$. In a case where a wave vector in an energy band gap of photonic crystal is k $nb_1+mb_2$ (n and m are arbitrary integers), it is possible to obtain a resonance mode (standing wave in XY plane) in which a wave number k becomes a Γ point, and the lattice interval a is identical to a wavelength λ. In addition, the mode A is a mode in which the lowest frequency is provided, and the mode B is a mode in which the second lowest frequency is provided.

Also, intensity modulation is performed on the in-plane electromagnetic field distribution of a standing wave in the aforementioned photonic crystal layer (in-plane polarization distribution of a point light source) through a polarizing plate. Thereafter, a shape obtained by performing Fourier transformation can be formed to be not only a unimodal beam (spot), but also a character shape, a group of two or more spots having the same shape, a vector beam, or the like, as described above.

In addition, a refractive index of the base layer 6A is in a range of 3.0 to 3.5, and a refractive index of the different refractive index region 6B is in a range of 1.0 to 3.4. Also, it is preferable that an average diameter of the different refractive index regions 6B 1 inside a hole of the base layer 6A may be in a range of 38 nm to 76 nm, and an average diameter of the different refractive index regions 6B2 inside the hole may be in a range of 24 nm to 54 nm.

As described above, any laser element as described above is also a laser element including a photonic crystal layer on which laser light is incident, and a plurality of different refractive index regions in the photonic crystal layer has a planar shape that is an approximate circle, an approximate square, or an approximate polygon having a rotational symmetry of 90°. In addition, when XY coordinates of a unit configuration region are (x, y), the rotational angle φ are different depending on a position (coordinates), and at least three different rotational angles φ are contained in all of the photonic crystal layer. A phase difference is caused according to the rotational angle φ, and therefore, a laser beam in a desired direction can be obtained. The rotational angle φ is a function of x, or a function of x and y in all or a specific area of the photonic crystal layer, and can form a spot.

A collection of spots can constitute a more complicated shape. In the aforementioned laser element, a far-field pattern image of the laser beam passing through the polarizing plate has a single- or multiple-spot shape, an annular shape, a linear shape, a character shape, a double annular shape, or the Laguerre-Gaussian beam shape. Also, a two-dimensional intensity distribution of the image obtained by performing inverse-Fourier transformation on the far-field corresponds to a distribution of the rotational angles φ of the second different refractive index regions at the positions of the unit configuration regions.

Figure 29:
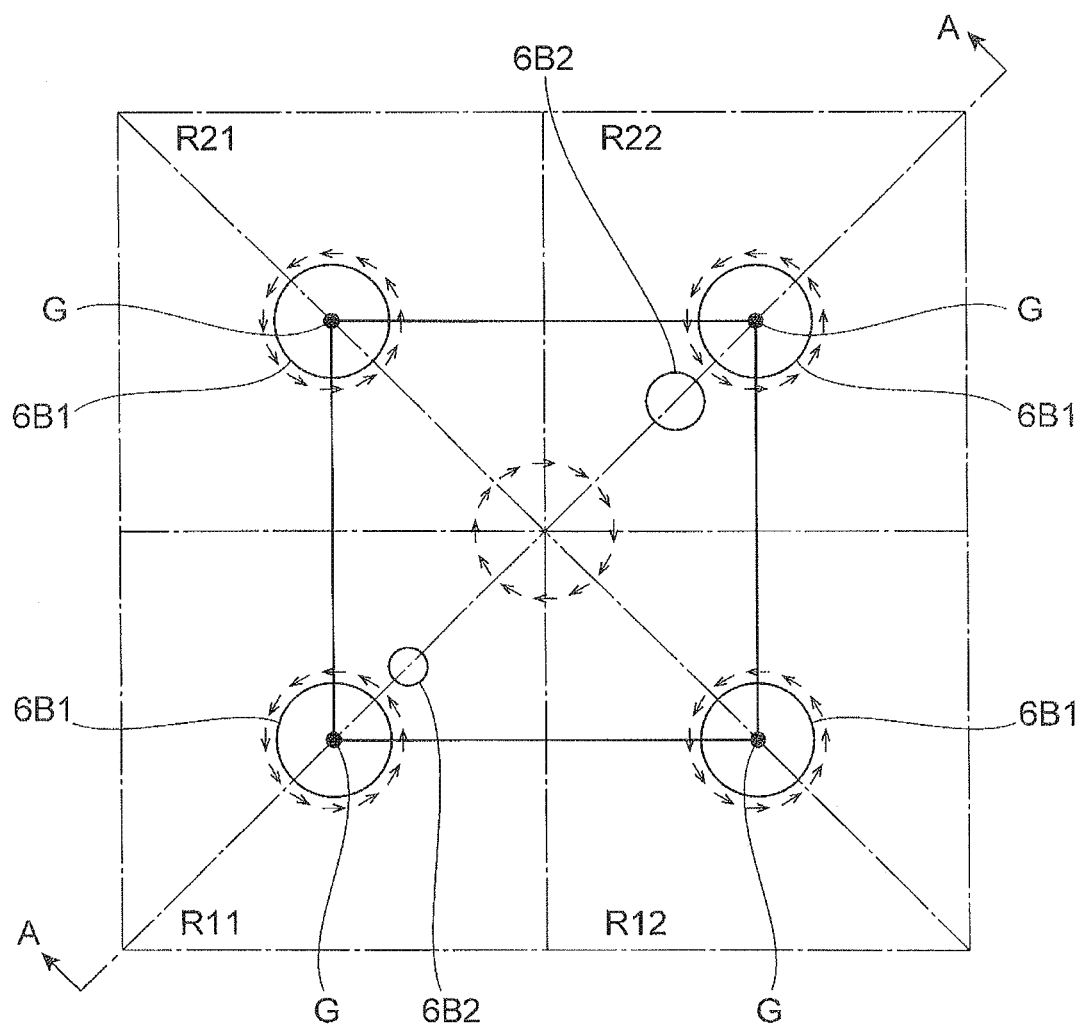
FIG. 29 is a diagram illustrating a positional relationship between different refractive index regions and an electric field distribution.

FIG. 29 is a diagram illustrating a positional relationship between different refractive index regions and an electric field distribution.

An area of the XY plane of the second different refractive index region 6B2 may be changed depending on a position. That is, diameters of the upper right second different refractive index region 6B2 and the lower left second different refractive index region 6B2 are different from each other, and the areas thereof are different from each other. By disposing the second different refractive index region 6B2 having a small diameter in the vicinity of the center G that is a lattice point, at this position, it is possible to change an electric flux density. In FIG. 29, second different refractive index regions 6B2 having two sizes are used, and are disposed on a line connecting the lattice points adjacent obliquely to each other (a diagonal line of a rectangle containing the center G). In this case, an electric flux density is given by a vector sum of respective electric flux densities of the second different refractive index regions 6B2. Since the sizes of the second different refractive index regions 6B2 are different, as a whole, deviation is caused in the electric flux density in the interior of the illustrated rectangle, and therefore, polarization components are generated in a predetermined direction. Since the upper right second different refractive index region 6B2 has a polarization component toward the lower right, and the lower left second different refractive index region 6B2 has a polarization component toward the upper left, some of the components are offset, but remaining components become all polarization components in the nit area.

Figure 30:
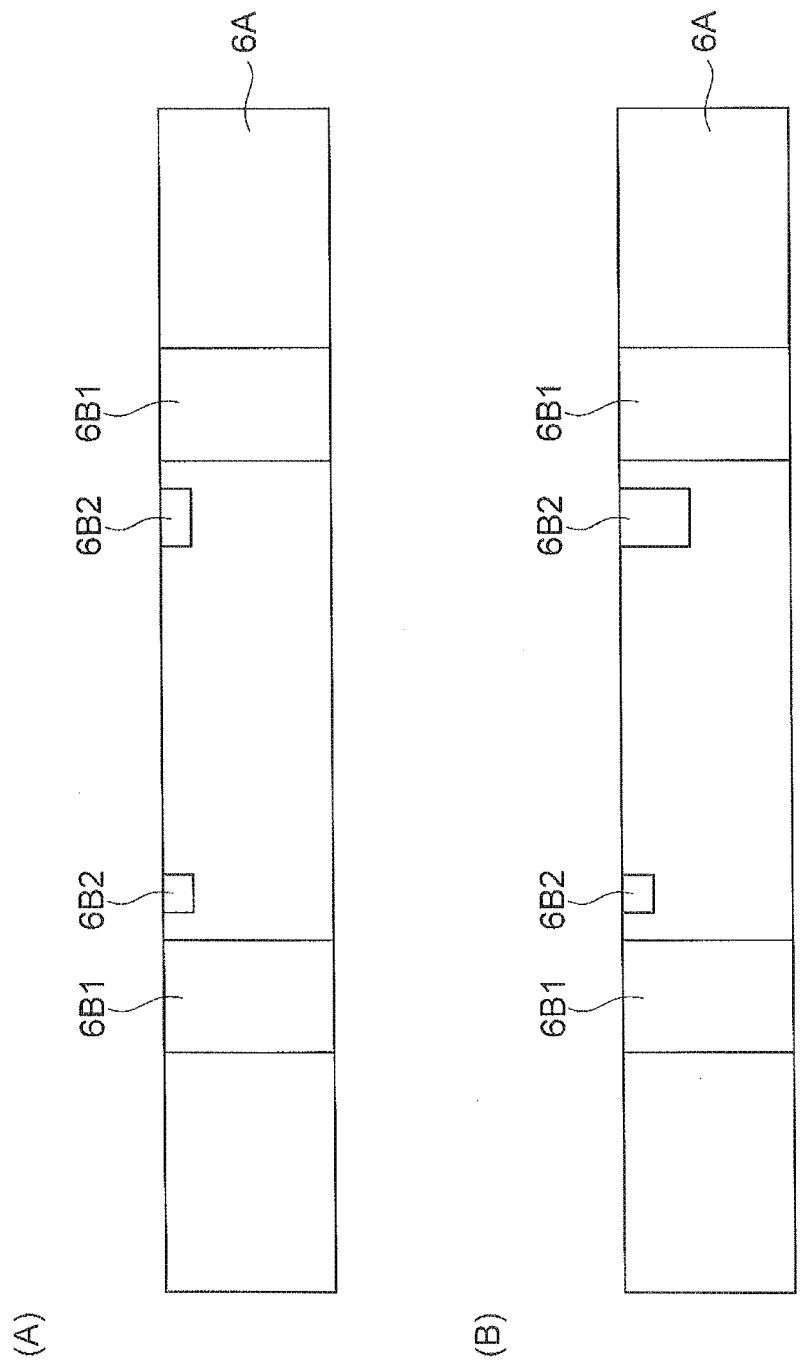
FIG. 30 is a longitudinal sectional view of a photonic crystal layer.

FIG. 30 is a longitudinal sectional view of the photonic crystal layer illustrated in FIG. 29, taken along an arrow A-A.

The second different refractive index regions 6B2 constituting the photonic crystal layer may have the same depth (thickness) as illustrated in FIG. 30(A), but may have different depths (thicknesses) as illustrated in FIG. 30(B). When the depths are different, a refractive index is changed. Therefore, by adjusting the depths of the second different refractive index regions 6B2, it is possible to change a phase of emission light. In FIG. 30(B), the second different refractive index region 6B2 having a larger diameter is illustrated as having a larger depth than the second different refractive index region 6B2 having a smaller diameter.

Figure 31:
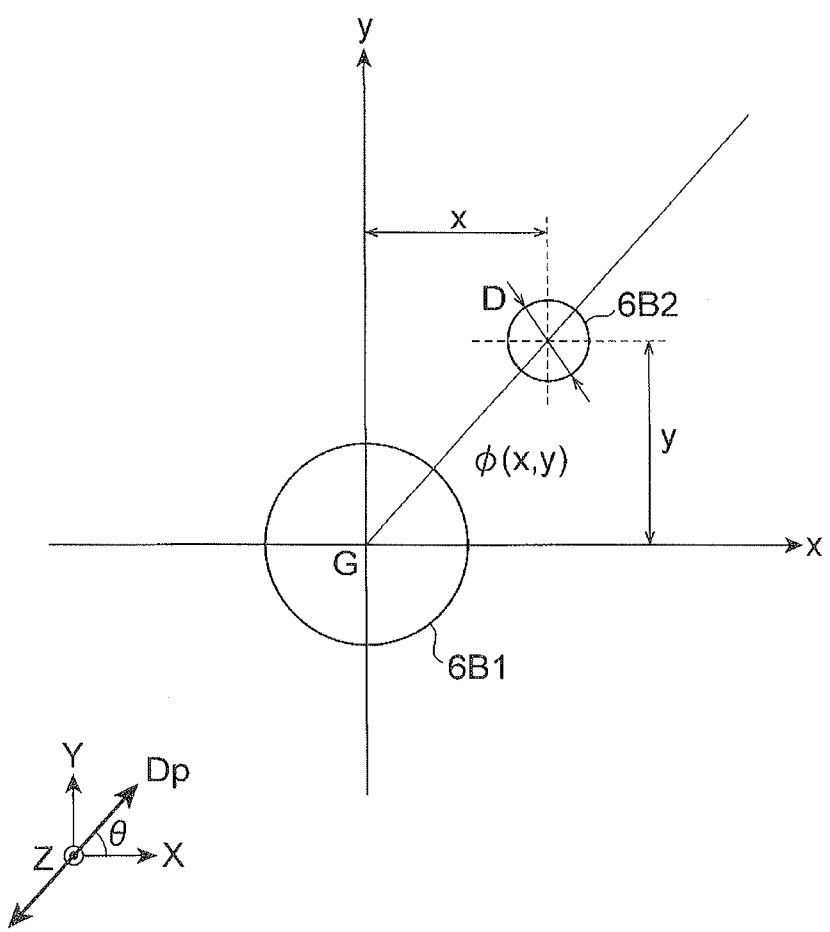
FIG. 31 is a graph illustrating positions of different refractive index regions.

FIG. 31 is a graph illustrating positions of different refractive index regions.

With respect to a center G of a first different refractive index region 6B1, a second different refractive index region 6B2 is disposed at a position of (x, y). An angle between the second different refractive index region 6B2 and the x axis is $\phi$ (x, y).

In this case, an intensity I of laser light after passing through a polarizing plate is represented by the following equation.

$$I(x,y) \propto f(x,y) \times g(\phi,\theta) \times h(D) \times p(X,Y) = f(x,y) \times g\{(\phi(x,y), \theta) \times h(D) \times p(X,Y)\}$$

Detailed description will be given below.

f(x, y) is a function representing a change in intensity according to an inter-unit lattice arrangement position (x, y) of a sub hole (the second different refractive index region 6B2).

Figure 32:
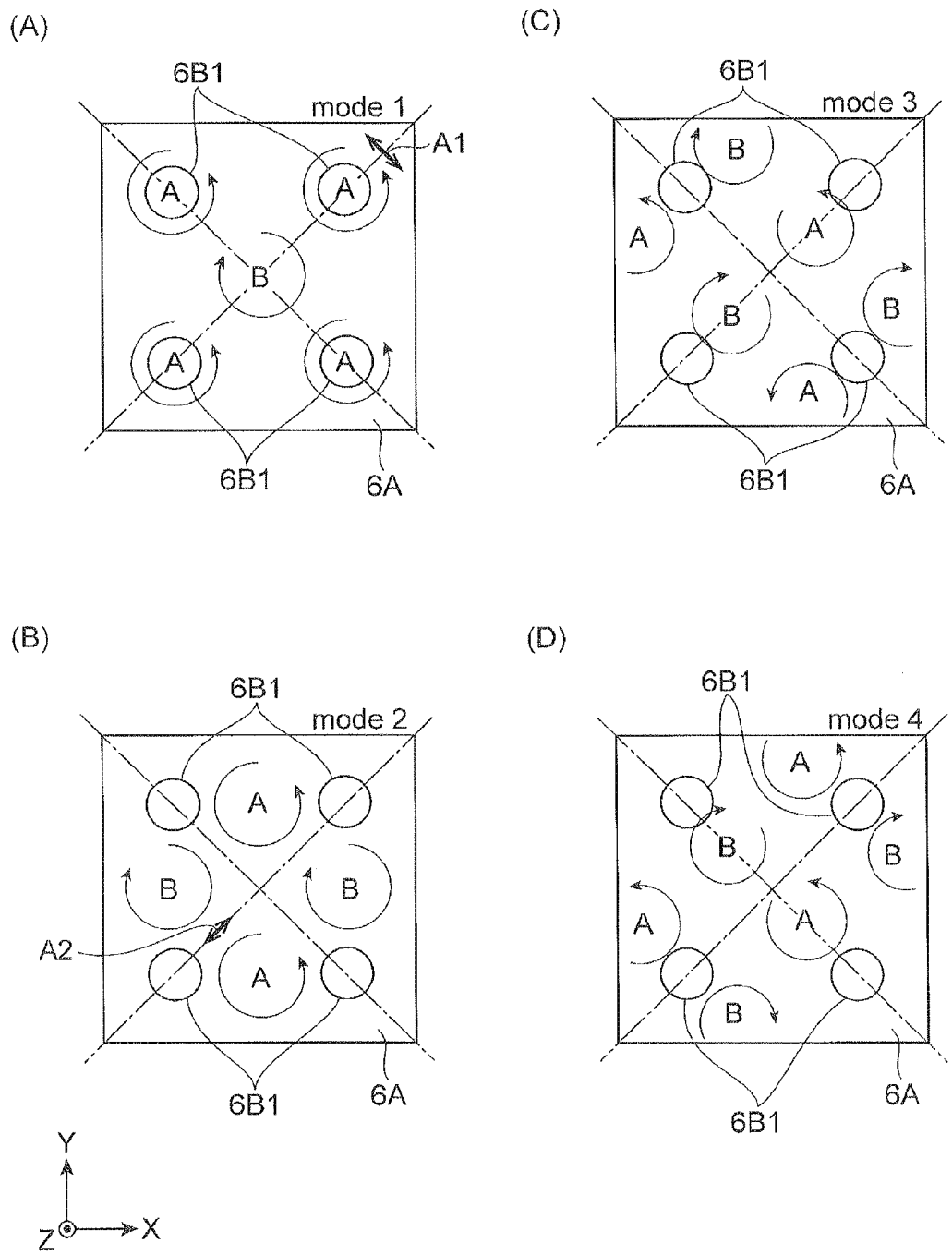
FIG. 32 is a diagram illustrating a mode provided by a photonic crystal layer.

FIG. 32 is a diagram illustrating a mode provided by the photonic crystal layer. Referring to FIG. 32, electric field distributions existing theoretically in a square lattice structure are mode 1 to mode 4. In a configuration in which light is introduced into the photonic crystal layer from the outside, the mode 1 to mode 4 have different resonance frequencies, and therefore, a mode can be selected according to a wavelength of the introduced light. In this case, a mode that is easy to handle is mode 1 or mode 2.

Also, in a configuration where a main hole (the first different refractive index region) is a resonator for oscillation, mode 3 and mode 4 causes a large light leakage from the resonator and has a very low possibility to oscillate, and therefore, either mode 1 or mode 2 has a possibility to oscillate. Accordingly, it is preferable to adopt mode 1 or mode 2.

In the case of mode 1 (FIG. 32(A)), an amplitude of a magnetic field becomes the maximum at positions of the main holes (a position of A in FIG. 32(A)). In addition, an amplitude of a magnetic field becomes the maximum at points spaced apart from the positions by a half of the lattice interval in the x direction and the y direction (a position of B in FIG. 32(A)). The magnetic field of A and B have phases which are displaced from each other by $\pi$. When A and B are referred to as a belly of the magnetic field, electric fields exist so as to surround the belly of the magnetic field. The orientation of an electric field to surround A and the orientation of an electric field to surround B are the opposite to each other in a certain moment. Also, an amplitude of the electric field becomes the maximum value in a central portion of a line connecting A and B adjacent to each other. The amplitudes of the electric field becomes zero in a central portion of a line connecting A and A adjacent to each other and in a central portion of a line connecting B and B adjacent to each other. Also, A1 and A2 indicate orientations of electric fields (polarization).

In the case of mode 2 (FIG. 32(B)), an electromagnetic field distribution is distributed as the electromagnetic field distribution of mode 1 is shifted by a half of the lattice interval, in the x direction or the y direction. The electromagnetic field distributions of mode 1 and mode 2 have characteristics as described above. f (x, y) is changed depending on an intensity of an electric field in a portion adjacent to the sub hole.

g ($\phi$, $\theta$) is a function indicating an intensity variation due to a polarization direction $\phi$ at a position of a sub hole and a transmission axis direction $\theta$ of a polarizing plate (where, f is changed by a position (x, y)). When the transmission axis direction $\theta$ of the polarizing plate is identical to an polarization direction at $\phi$ (x, y), a transmittance becomes high and the intensity increases.

Specifically, $g(\phi, \theta) = I_0 \cos^2(\theta - \phi)$ is given. In this case, $I_0$ is a value determined by light loss due to the polarizing plate, and corresponds to the transmittance of the polarizing plate in the case of $\theta = \phi$. $\phi$ is a polarization direction of output light in the sub hole, and $\theta$ is a transmission axis direction of the polarizing plate.

h (D) is a function indicating an intensity variation due to a diameter of the sub hole.

As described above, the electric field distribution of mode 1 or mode 2 has a possibility to use. In both of mode 1 and mode 2, the electric field distribution is necessarily anti-symmetric with respect to a center of the main hole in a case where there is no sub hole. In other words, electric fields at symmetrical positions with respect to the center of the main hole, have opposite orientations and the same magnitude. Therefore, in light diffracted in the Z direction when there is no sub hole is offset, the electric field of which orientations are opposite to each other are offset (destructive interference), a net energy propagation amount becomes zero (in the case of an infinite periodic structure). When a sub hole is provided, the electric field in an xy plane which vertically traverses a sidewall of the sub hole varies depending on a difference in dielectric constant between the inside and outside of the hole. That is, an electric field inside the sub hole has the opposite orientation to and a different magnitude from an electric field at a position symmetrical to the sub hole with respect to a center of the main hole. The difference between the two electric fields causes diffraction in the z direction. The change due to electric field asymmetry in the xy plane that depends on a change in opening is defined as ha (D).

In addition, a diffraction intensity in the z-axis direction is changed by a change in the size of a hole. The diffraction efficiency is proportional to an optical coupling coefficient κ1 represented by one order coefficient in the case of performing Fourier transform a hole shape. The optical coupling coefficient is described in, for example, K. Sakai et al., "Coupled-Wave Theory for Square-Lattice Photonic Crystal Lasers With TE Polarization, IEEE J. Q. E. 46, 788-795 (2010)". In this case, h (D)∝ha (D)×κ1 (D) is given, where ha (D) is a change in the electric field asymmetry in the xy plane which is dependent on a change in opening, and κ1 (D) is a one-order optical coupling coefficient which is dependent on the change in opening. When the lattice constant defining an interval of the center G is set as a, a filling factor of the different refractive index region is given as $F=\pi \times (D/2)^2/a^2$.

p (X, Y) is an intensity distribution function at the position (X, Y) in the photonic crystal layer. It is possible to calculate an envelope intensity distribution of the whole element by using the optical coupling wave theory disclosed in Y Liang et al., "Three-dimensional coupled-wave analysis for square-lattice photonic crystal surface emitting lasers with transverse-electric polarization: finite-size effects," Opt Express 20, 15945-15961 (2012).

FIG. 33 is a diagram illustrating a laser device including a laser element and a polarizing plate.

Laser light having a plurality of polarization directions Dp is output from a light emission surface of the laser element LD (FIG. 33(A)). The laser light is intensity-modulated by passing through the polarizing plate P. FIG. 33(B). That is, the laser device includes the aforementioned laser element LD, and a polarizing plate P which faces a light emitting surface of the laser element LD.

In the aforementioned laser element, positions of sub holes are different with respect to unit lattices, and therefore, thereby obtaining light having different polarizations with respect to the unit lattices. Therefore, by combining polarizing plates on an emission side, it is possible to obtain plane waves of which intensities are different but phases are aligned with respect to the unit lattices.

In the aforementioned laser element, a plane wave with different intensities for respective unit lattices is obtained as emission light. In other words, a plane wave with different intensities for respective positions is obtained as emission light. When the plane wave with different intensities for respective positions is obtained, it is possible to obtain a hologram using the method described in W. H. Lee, "Sampled fourier transform hologram generated by computer," Appl. Opt. 9, 639-643 (1970). Therefore, it is possible to obtain a certain beam pattern.

When an example is described according to a specific procedure, for example, a desired beam pattern, that is, two-dimensional angle-intensity information is prepared as a two-dimensional array, and two-dimensional discrete Fourier transformation or two-dimensional fast Fourier transformation is performed on the two-dimensional angle-intensity information, thereby obtaining a two-dimensional array with a complex amplitude. In this case, the number of elements of the two-dimensional array of the angle-intensity information of an originally prepared beam pattern is equal to the number of elements of the two-dimensional array with the complex amplitude after transformation. The complex amplitude of each element is composed of a real part and an imaginary part, and the real part and the imaginary part have a positive or negative value, respectively.

According to the method of the aforementioned Lee literature, four divided stripe-shaped regions having the same width correspond to one complex amplitude as described above and intensities of the divided regions are assigned according to the following procedure. In this case, the stripe-shaped regions are defined as a first region, a second region, a third region, and a fourth region sequentially from the left. When a real part of the above complex amplitude has a positive value, a value of the real part of the complex amplitude is assigned to the first region, and zero is assigned to the third region. When the real part of the above complex amplitude has a negative value, zero is assigned to the first region, and an absolute value of the value of the real part of the complex amplitude is assigned to the third region. When the real part of the complex amplitude is 0, 0 is assigned to the first region and the third region. In addition, when an imaginary part of the above complex amplitude has a positive value, a value of the imaginary part of the complex amplitude is assigned to the second region, and zero is assigned to the fourth region. When the imaginary part of the above complex amplitude has a negative value, zero is assigned to the second region, and an absolute value of the value of the imaginary part of the complex amplitude is assigned to the fourth region. When the imaginary part of the complex amplitude is 0, 0 is assigned to the second region and the fourth region. The values assigned as described above are all negative values, and it is possible to perform correspondence of the intensity distributions.

After the intensity distributions are assigned to respective strip-shaped regions according to the aforementioned procedure, positions of sub holes are assigned so as to obtain a desired intensity distribution. That is, according to the function g (φ, θ) representing an intensity change due to the polarization direction φ and the transmission axis direction θ of the polarizing plate, the intensity distribution of each location is converted to the arrangement of sub holes. According to the aforementioned procedure, it is possible to obtain positions of the sub holes for obtaining a desired beam pattern.

Although, as the method for determining the positions of the sub holes from a desired beam pattern, the method of Lee is provided, the present invention is characterized to obtain a certain intensity distribution in which phases are aligned by the arrangement of the sub holes, and other methods may be considerable in addition to the method of Lee, as a method of determining the positions of the sub holes. For example, although a method to assign intensity distributions to three strip-shaped regions and obtain a result similar to the method of Lee is disclosed in C. B. Burckhardt, "A simplification of Lee's method of generating holograms by computer," Appl. Opt. 9, 1949 (1970), this method may be used or another method capable of obtaining equivalent results may be used.

Figure 34:
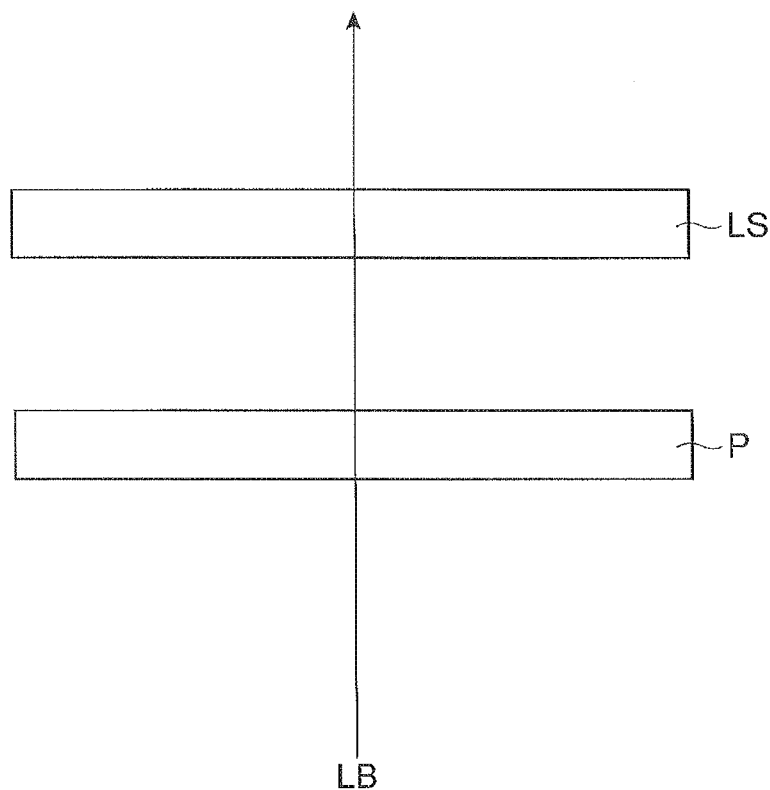
FIG. 34 is a diagram illustrating main portions of a laser device including a polarizing plate and a lens.

FIG. 34 is a diagram illustrating main portions of a laser device including a polarizing plate P and an optical element LS. That is, it is possible to dispose the optical element LS, such as a lens or a hologram, at a subsequent stage of the polarizing plate P. The optical element LS is capable of performing Fourier transformation on incident laser light and output the laser light.

REFERENCE SIGNS LIST

6 . . . photonic crystal layer, 6A . . . base layer, 6B1 . . . first different refractive index region, 6B2 . . . second different refractive index region

The invention claimed is:

1. A laser element including a photonic crystal layer whereon laser light is incident, the photonic crystal layer comprising:

a base layer formed of a first refractive index medium; and a plurality of different refractive index regions formed of a second refractive index medium having a refractive index different from that of the first refractive index medium and disposed in the base layer, the plurality of different refractive index regions comprising:

a first different refractive index region of which a planar shape is an approximate circle, an approximate square, or an approximate polygon having a rotational symmetry of 90° and a first area perpendicular to a thickness direction;

wherein central positions of the first different refractive index regions are disposed at lattice point positions of a square lattice or a triangular lattice, and wherein a second different refractive index region having a second area perpendicular to a thickness direction, the second area being smaller than the first area, a unit configuration region includes:

one first different refractive index region and one second different refractive index region provided in a nearest vicinity of the first different refractive index region, and wherein only two different refractive index regions exist in each of the unit configuration regions, wherein line segments are defined by lines connecting two closest neighboring central positions of the first different refractive index regions, each of the unit configuration regions is defined as an area surrounded by perpendicular bisectors of the line segments, the unit configuration regions are the same;

wherein the first different refractive index region and the second different refractive index region are positioned as a pair fully inside the unit configuration region, wherein, in the unit configuration region, a rotational angle of the second different refractive index region with respect to the nearest first different refractive index region is denoted by $\phi$, wherein, in an XY plane including an X axis and an Y axis, a plurality of the unit configuration regions is arranged two-dimensionally, wherein, XY coordinates of each of the unit configuration regions is given to a central position of the first different refractive index region, and wherein, when the XY coordinates of the unit configuration regions are (X, Y), the rotational angles $\phi$ differ depending on position, and at least three different rotational angles $\phi$ are contained in all of the photonic crystal layer.

2. The laser element according to claim 1, further comprising:

an active layer configured to emit the laser light;

upper and lower cladding layers between which the active layer is interposed; and the photonic crystal layer disposed between the upper or lower cladding layer and the active layer.

3. A laser device, comprising:

the laser element according to claim 2; and a polarizing plate disposed to face a light emitting surface of the laser element.

4. A laser device, comprising:

the laser element according to claim 1; and a polarizing plate disposed to face a light emitting surface of the laser element.

* * * * *